US012751319B2

(12) United States Patent
Oh et al.

(10) Patent No.: US 12,751,319 B2
(45) Date of Patent: Sep. 29, 2026

(54) DISPLAY APPARATUS

(71) Applicants: LG ELECTRONICS INC., Seoul (KR); LG Display Co., Ltd., Seoul (KR)

(72) Inventors: Taesu Oh, Seoul (KR); Joonkwon Moon, Seoul (KR); Sungjin Park, Seoul (KR); Bongseok Choi, Seoul (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 1177 days.

(21) Appl. No.: 17/742,239

(22) Filed: May 11, 2022

(65) Prior Publication Data

US 2022/0375894 A1 Nov. 24, 2022

(30) Foreign Application Priority Data

May 21, 2021 (KR) .................. KR10-2021-0065784

(51) Int. Cl.

*H01L 25/16* (2023.01)
*H10W 90/00* (2026.01)
*H10W 72/00* (2026.01)
*H10W 72/30* (2026.01)

(52) U.S. Cl.

CPC ........ *H10W 90/00* (2026.01); *H10W 72/0198* (2026.01); *H10W 72/07302* (2026.01); *H10W 72/07307* (2026.01); *H10W 72/334* (2026.01); *H10W 90/732* (2026.01)

(58) Field of Classification Search

CPC ..... H01L 24/95; H01L 24/83; H01L 25/0753; H01L 25/167; H01L 2224/29018; H10H 20/01; H10H 20/857; H10H 29/02; H10H 20/00; H10W 72/0198; H10W 72/07302; H10W 72/07307; H10W 72/334; H10W 70/682

See application file for complete search history.

(56) References Cited

U.S. PATENT DOCUMENTS

2020/0027757 A1* 1/2020 Lin ......................... H01L 21/68
2020/0091386 A1 3/2020 Torrents Abad
2020/0335483 A1 10/2020 Arutinov et al.
2022/0216087 A1* 7/2022 Van Den Brand ......... C09J 7/35
2022/0230997 A1 7/2022 Choi

FOREIGN PATENT DOCUMENTS

EP 3 742 477 A1 11/2020
KR 20190076929 A * 7/2019
KR 10-2020-0091429 A 7/2020
WO WO 2020/251076 A1 12/2020

OTHER PUBLICATIONS

Translation KR 20190076929 (Year: 2019).*

* cited by examiner

*Primary Examiner* — Matthew C Landau
*Assistant Examiner* — Halee Cramer
(74) *Attorney, Agent, or Firm* — Birch, Stewart, Kolasch & Birch, LLP

(57) ABSTRACT

A display device includes a substrate including a plurality of pixels, a plurality of protrusions on the substrate, an adhesive layer on the substrate, and a plurality of semiconductor light emitting devices on the adhesive layer. The semiconductor light emitting devices can be disposed in a pixel among the plurality of pixels, and the plurality of protrusions can be disposed around the plurality of semiconductor light emitting devices in the pixel.

19 Claims, 21 Drawing Sheets

[FIG. 1]
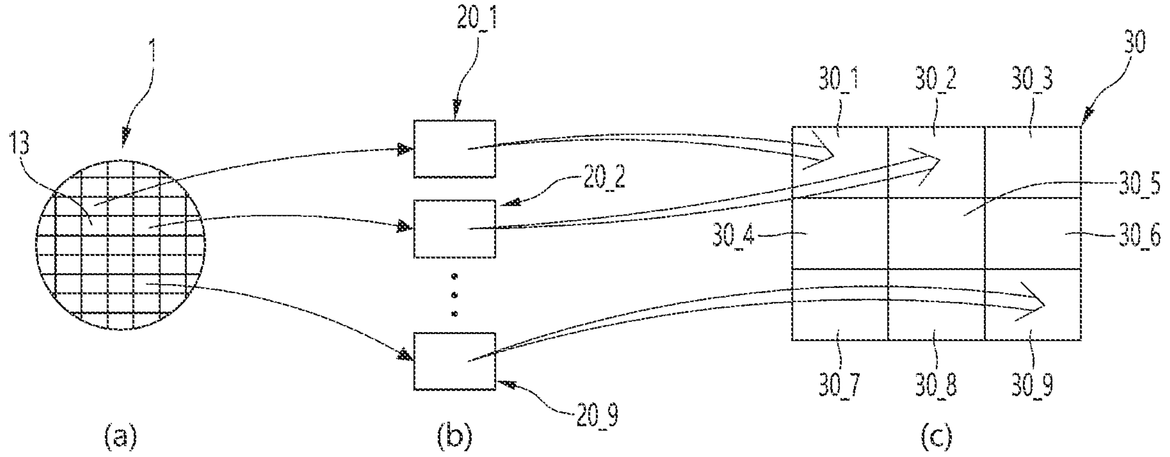
[FIG. 2]
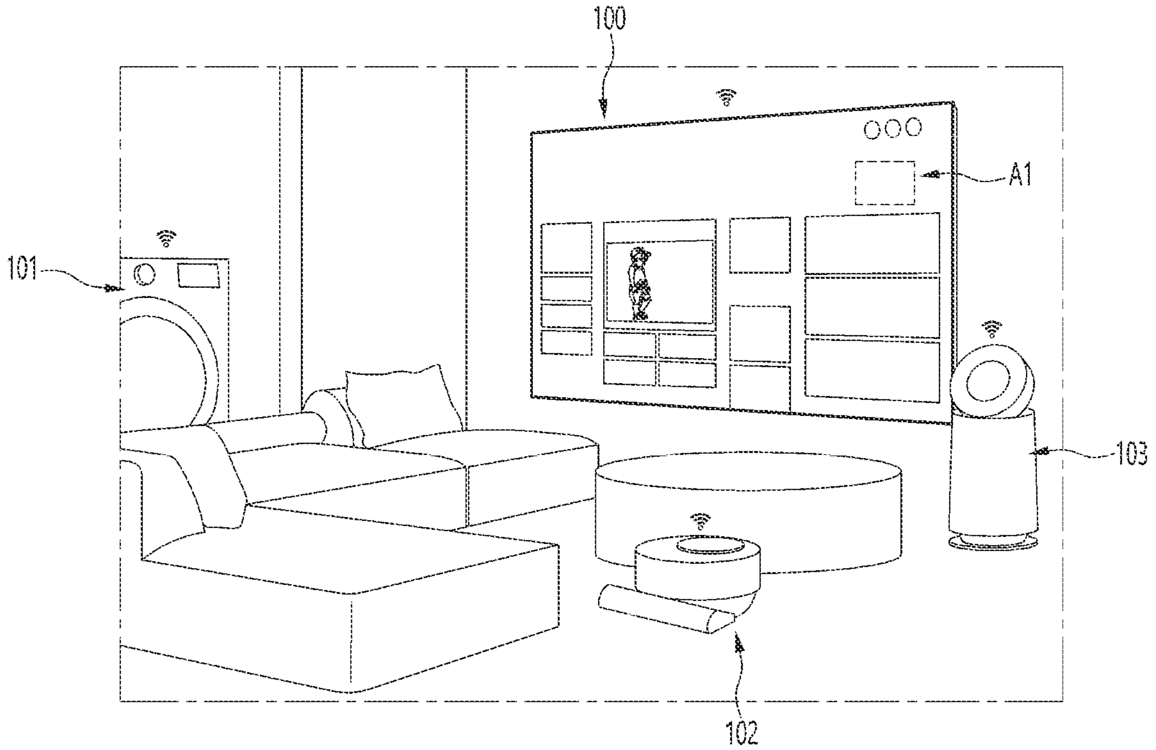

[FIG. 3]
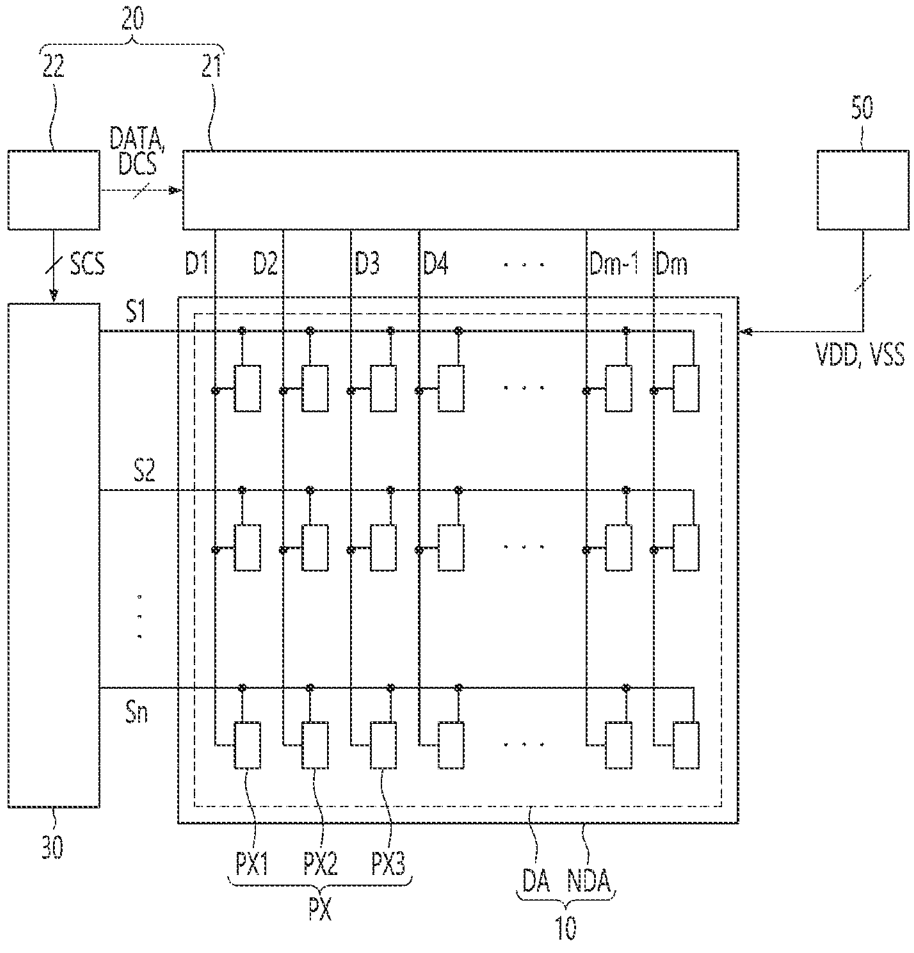

[FIG. 4]
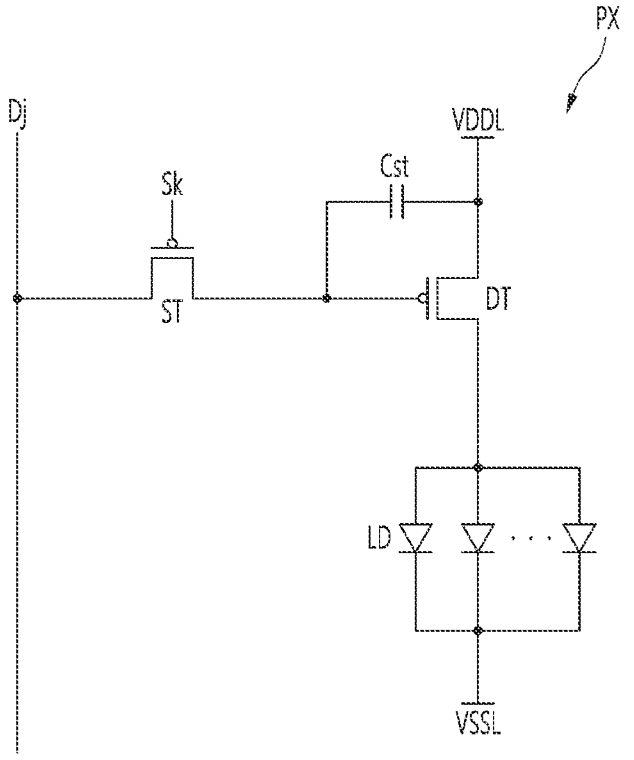

[FIG. 5]
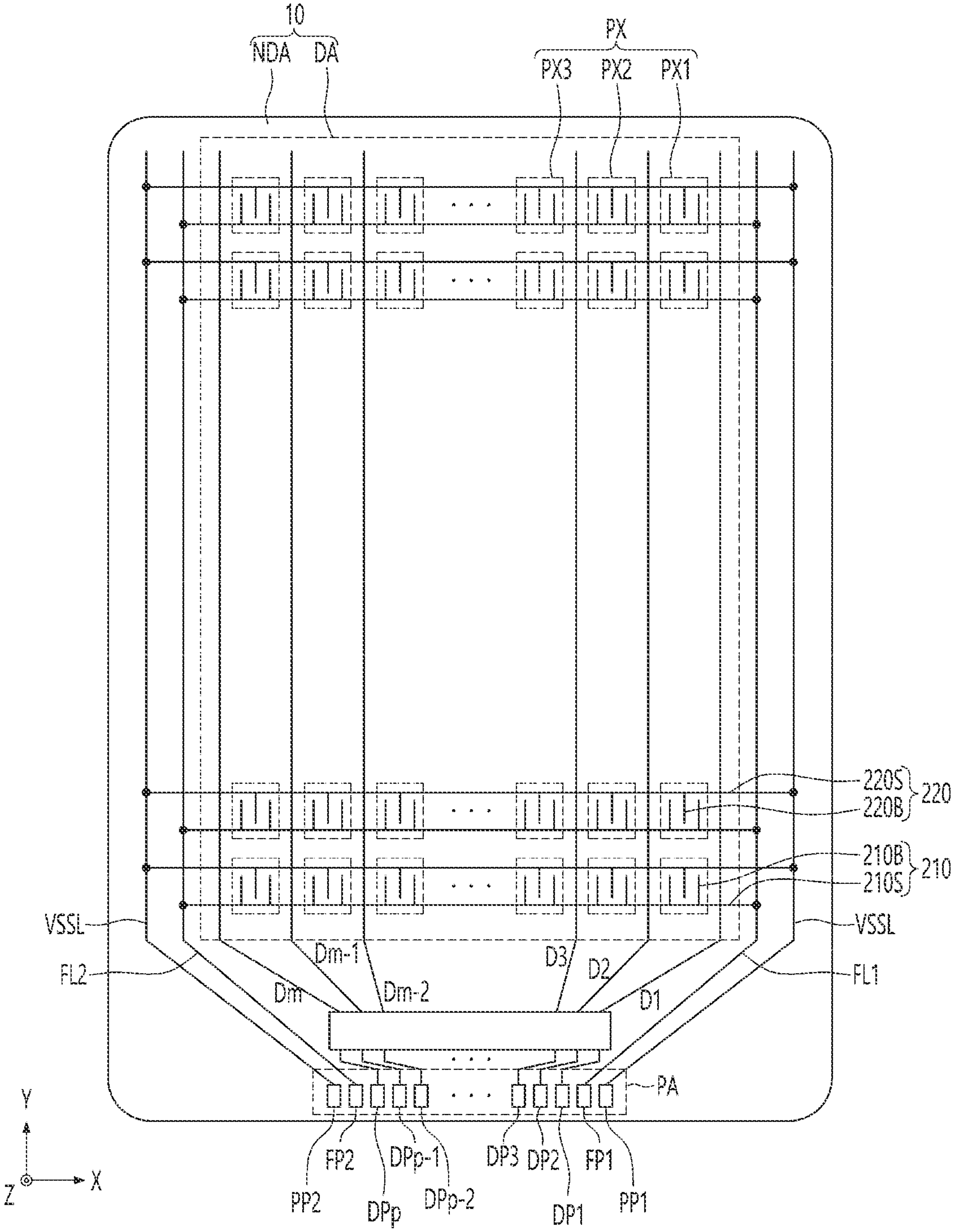

[FIG. 6]
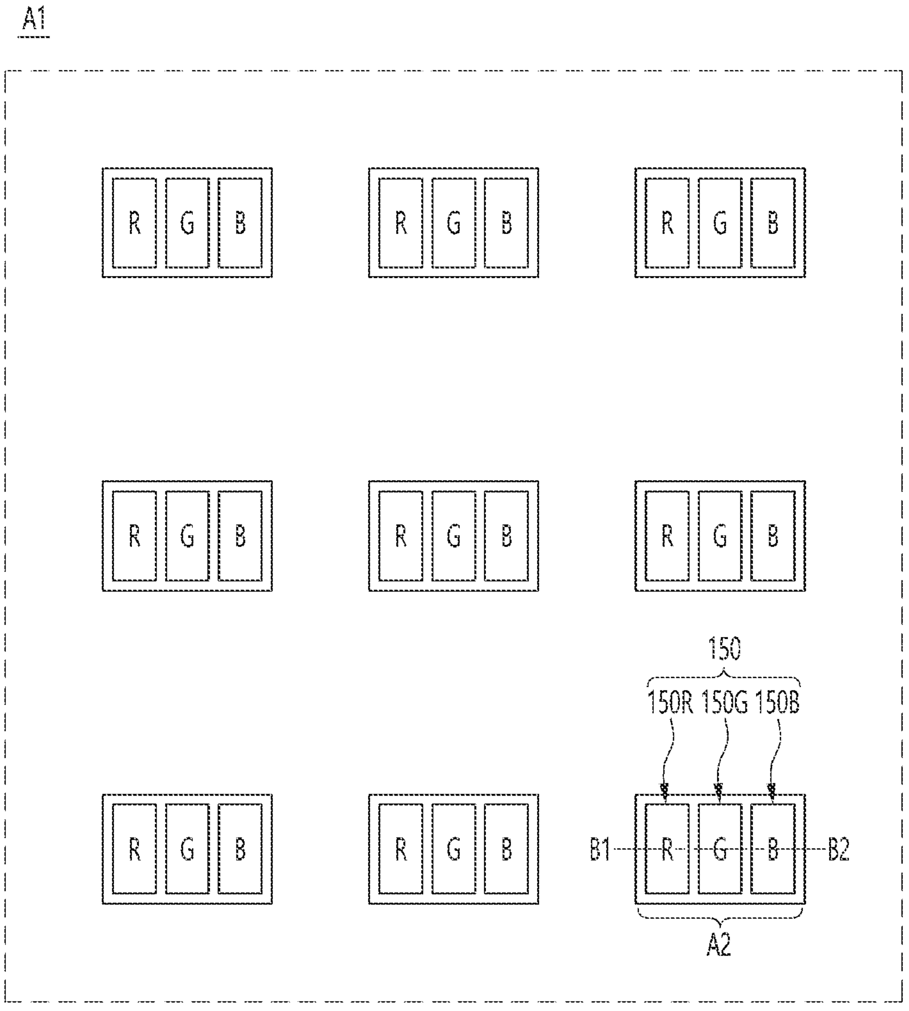

[FIG. 7]
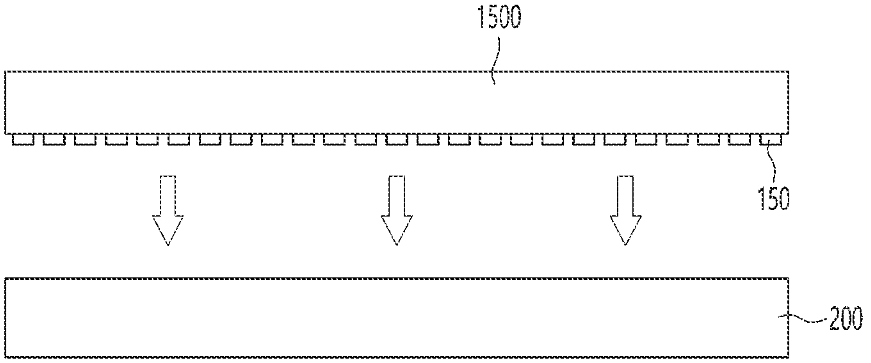
[FIG. 8]
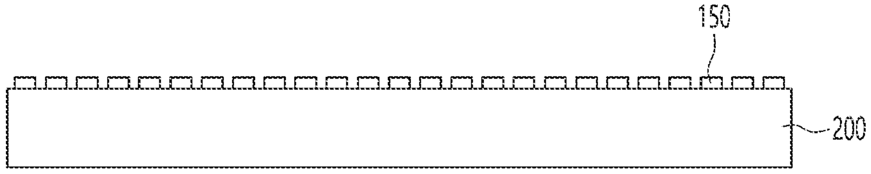
[FIG. 9]
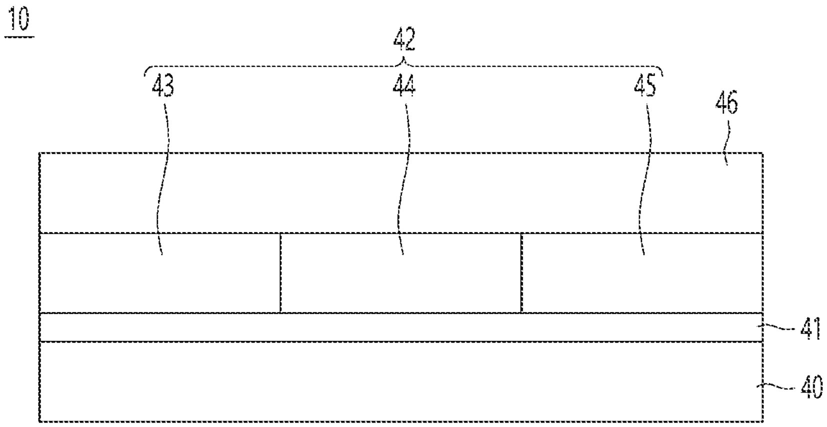

[FIG. 10]
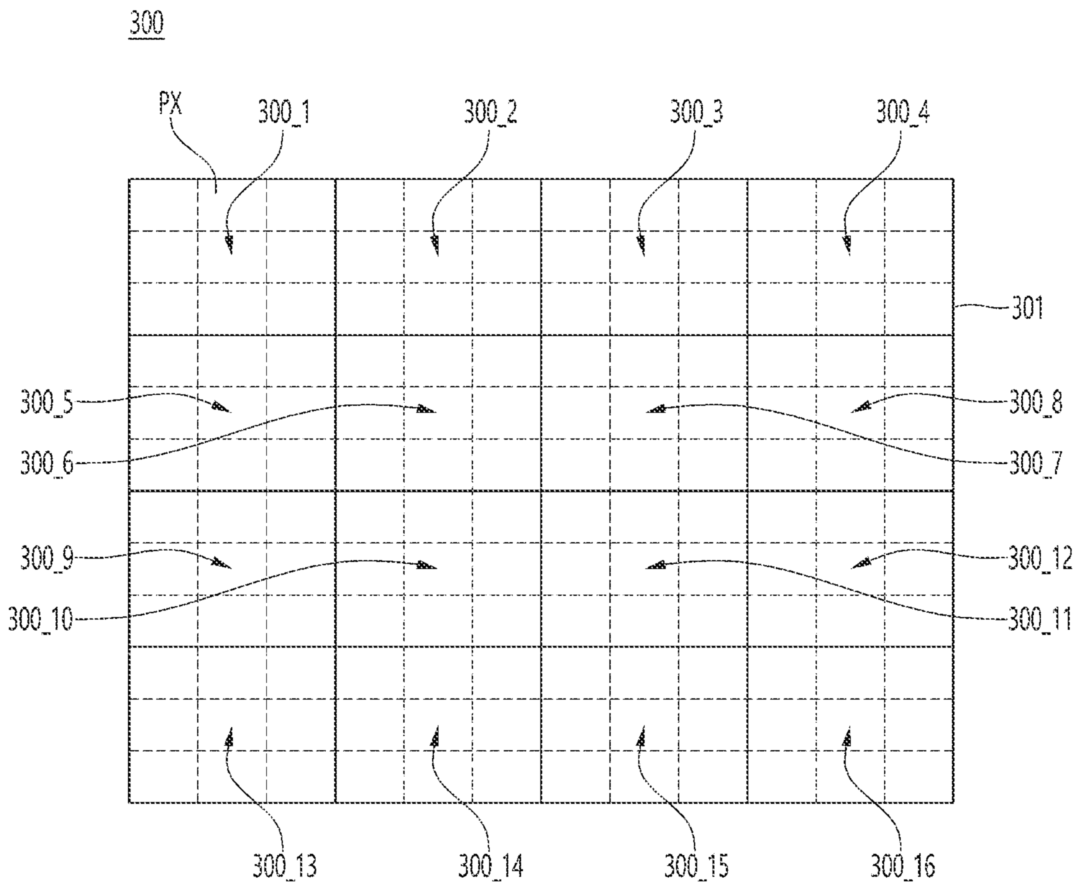
[FIG. 11]
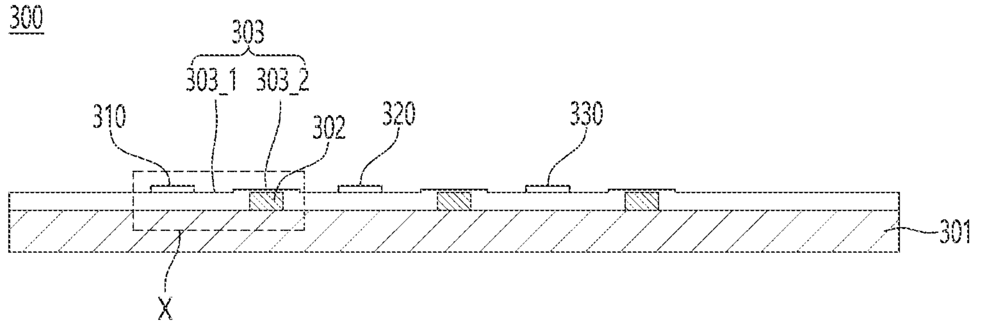

[FIG. 12]
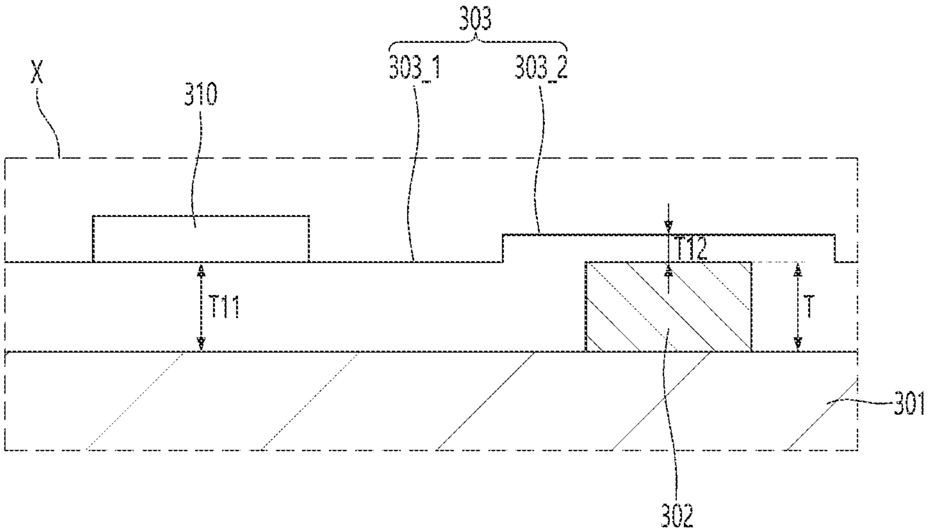

[FIG. 13]
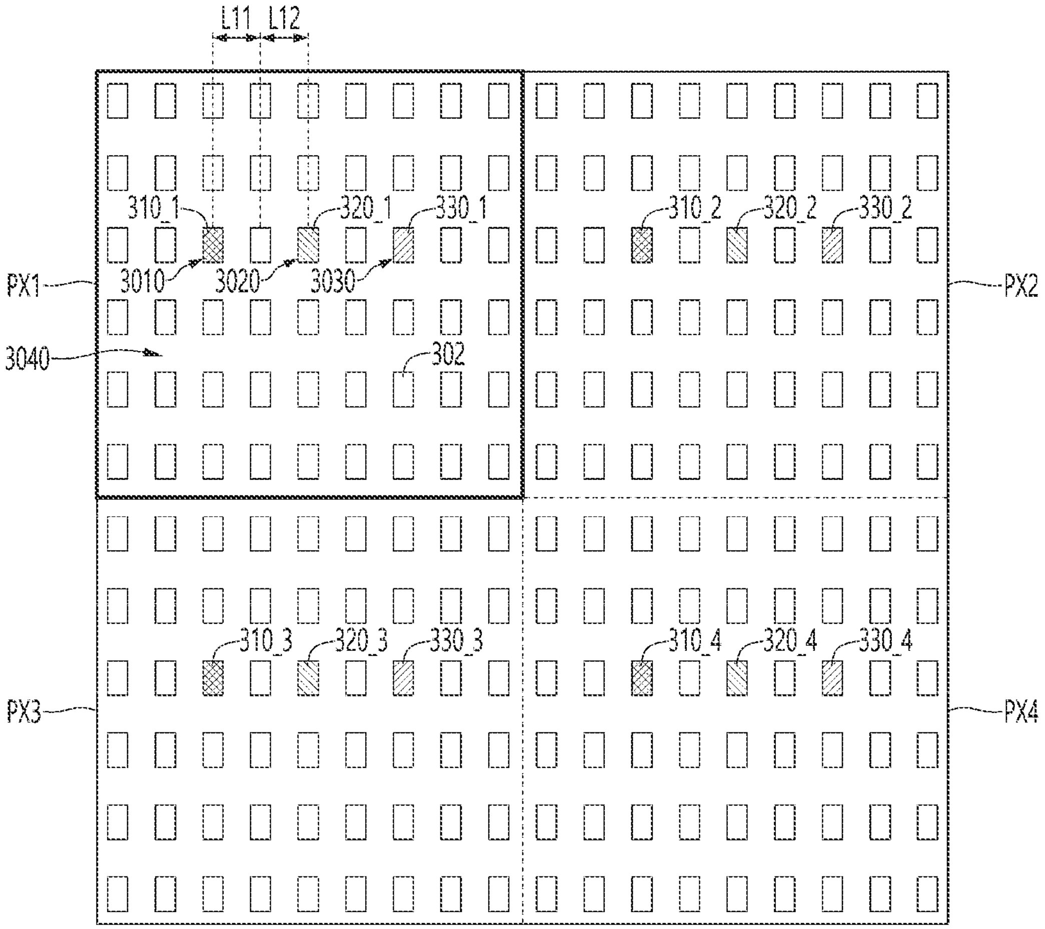

[FIG. 14]
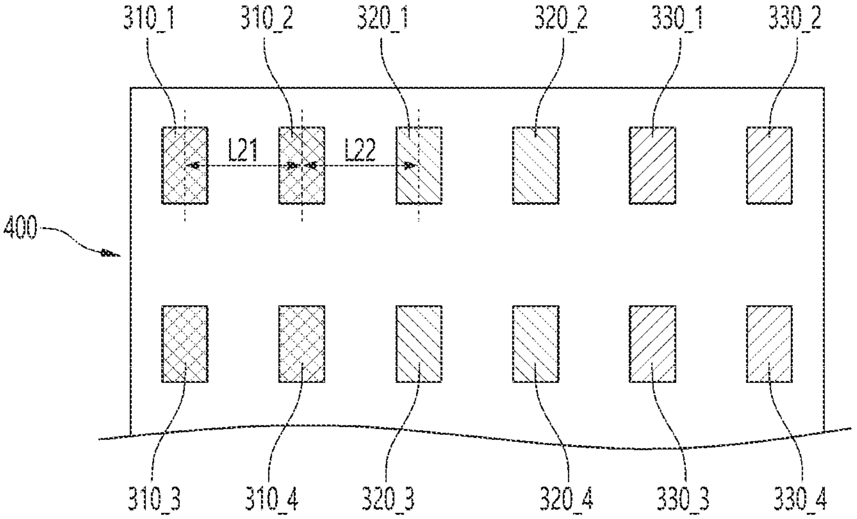
[FIG. 15]
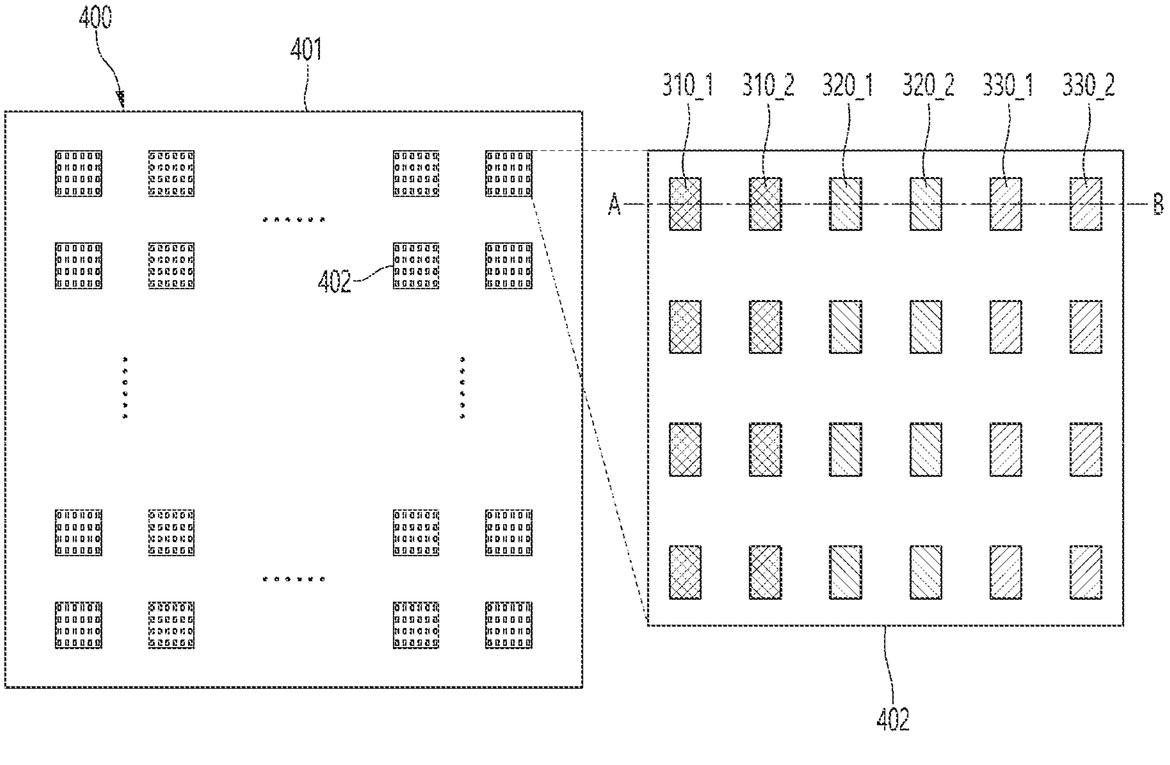

[FIG. 16]
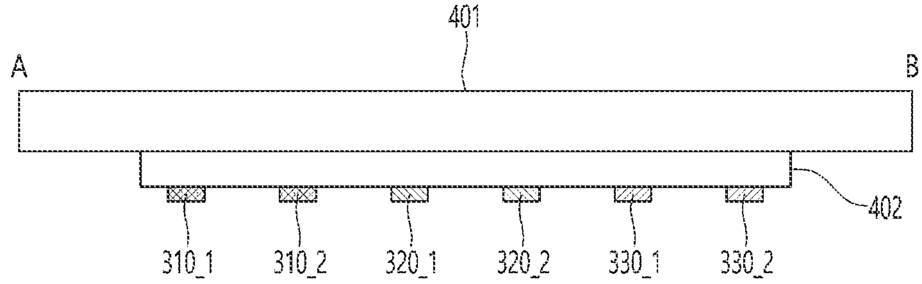
[FIG. 17]
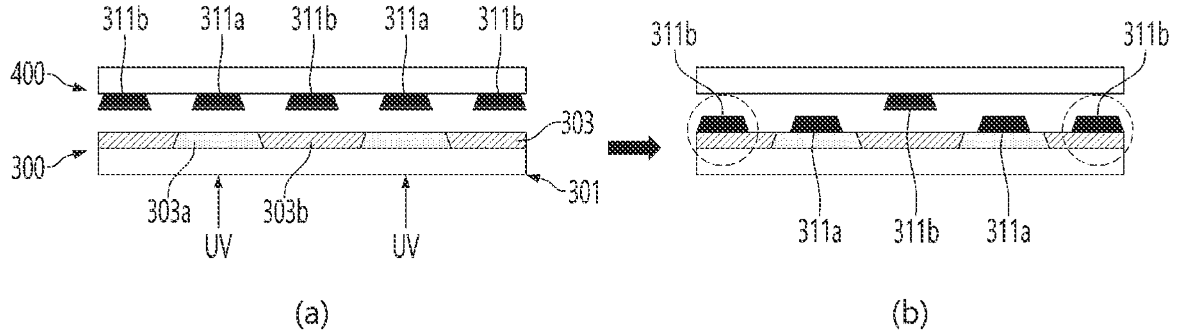
[FIG. 18]
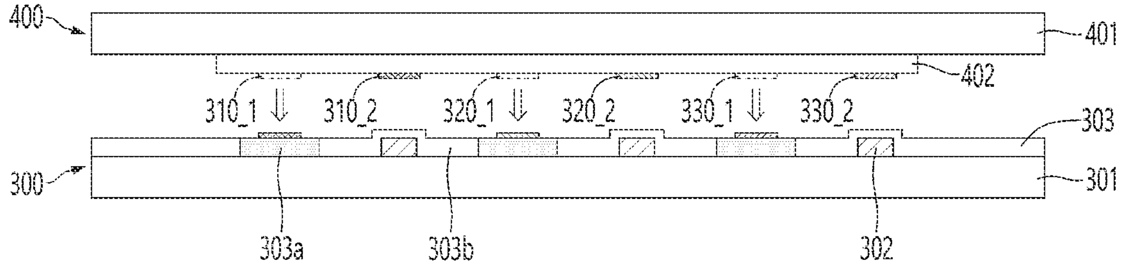

[FIG. 19]
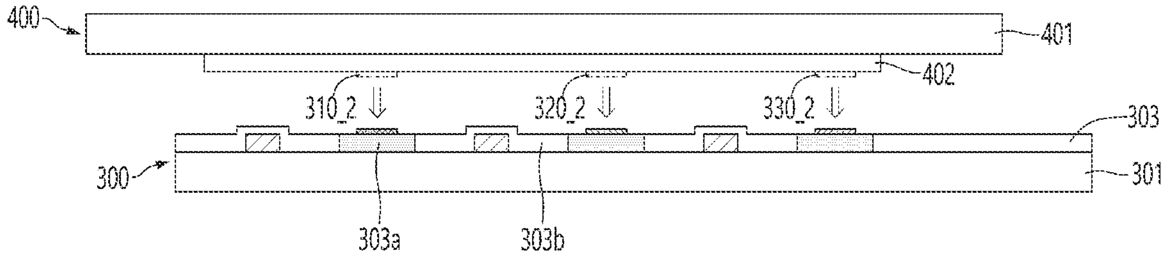
[FIG. 20]
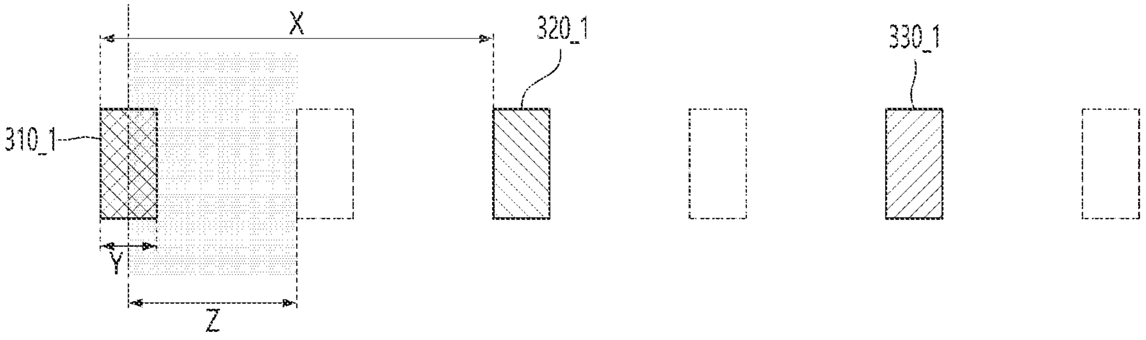
[FIG. 21]
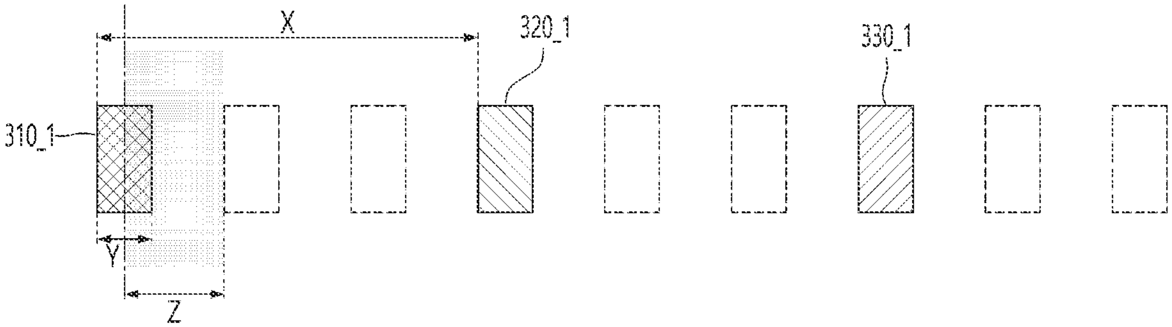

[FIG. 22]
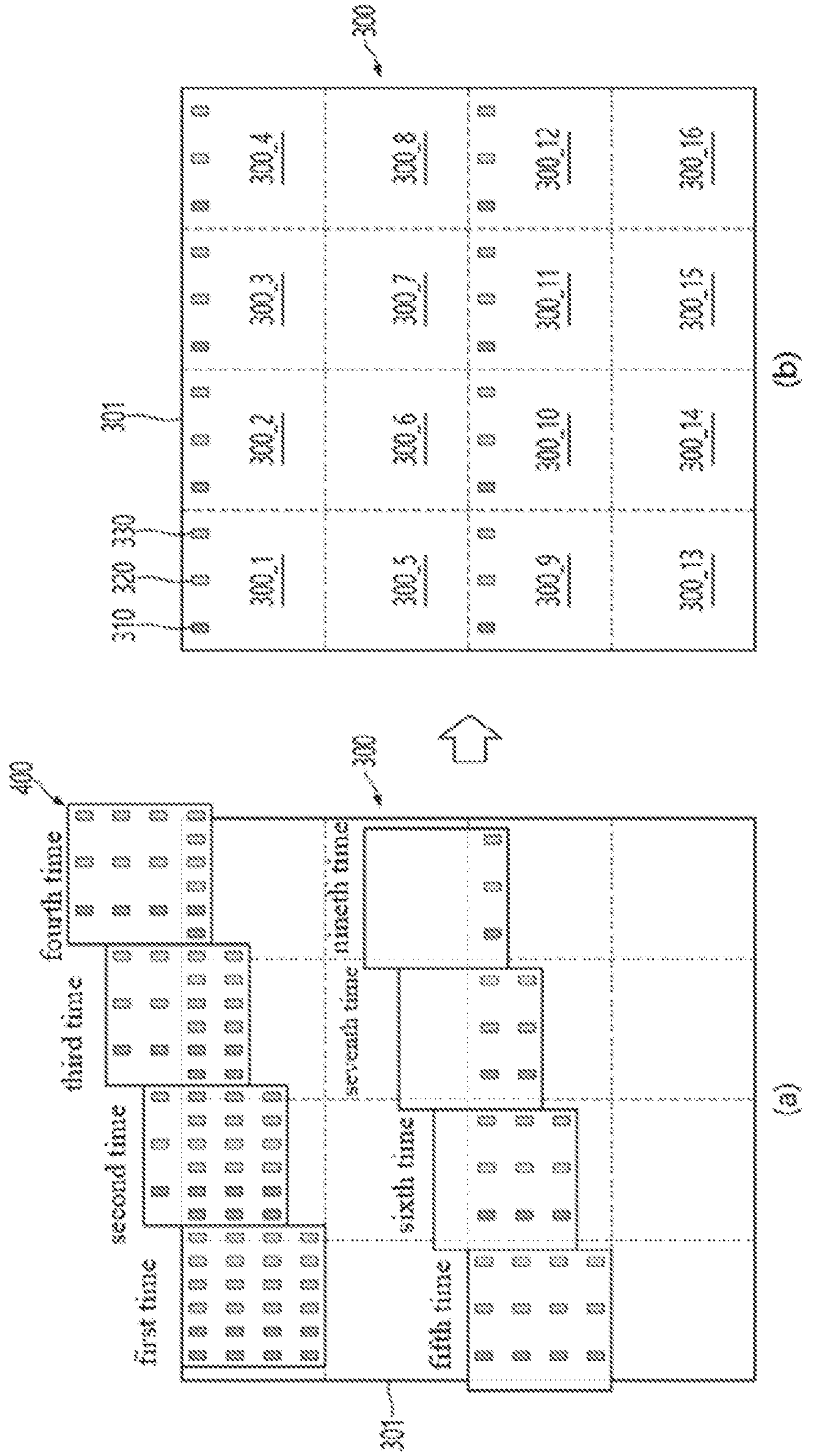

[FIG. 23]
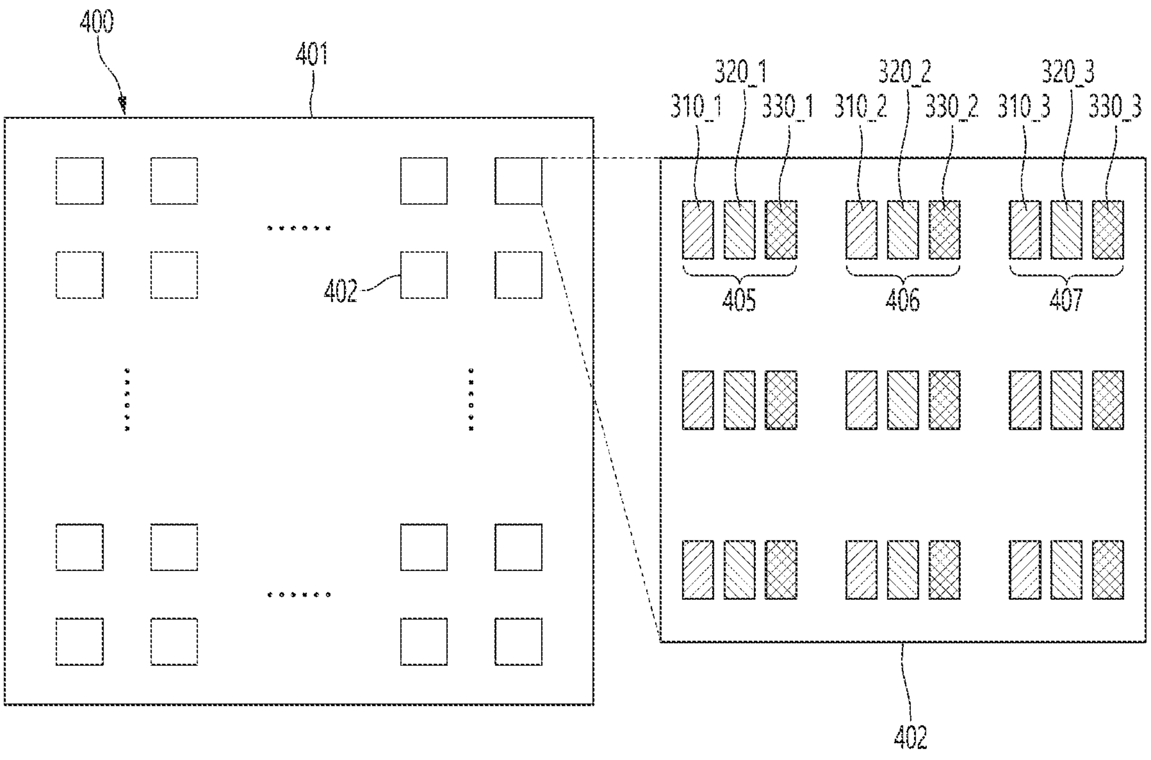
[FIG. 24]
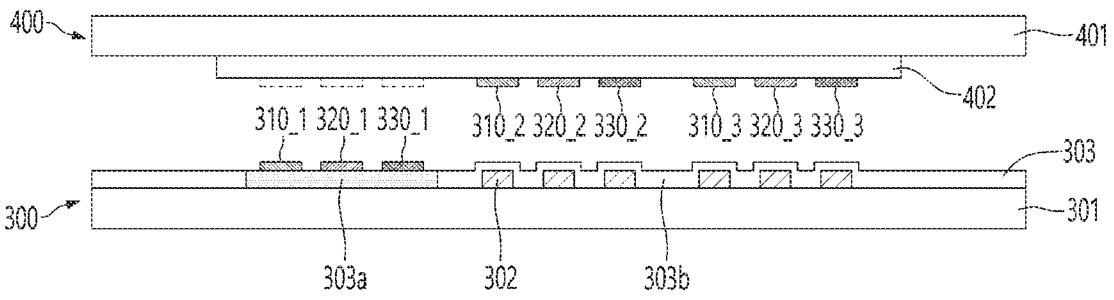

[FIG. 25]
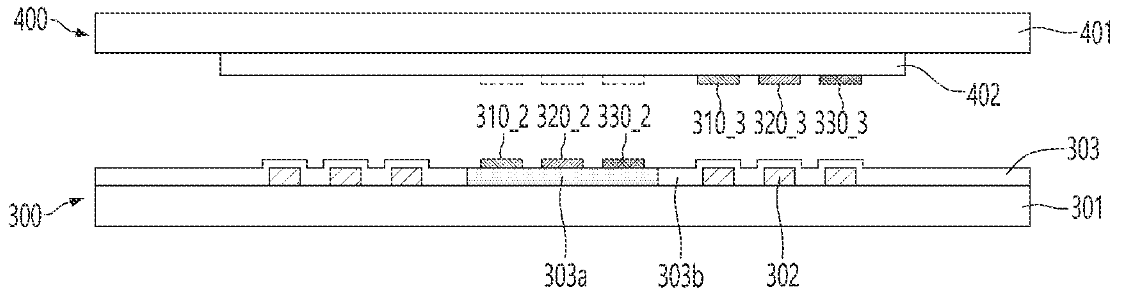
[FIG. 26]
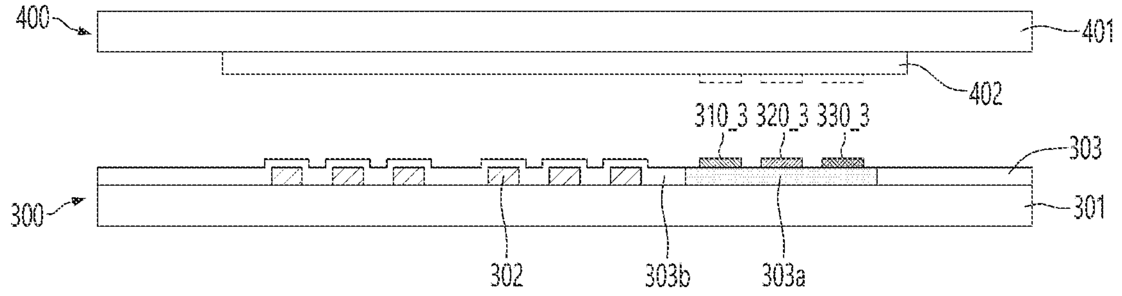
[FIG. 27]
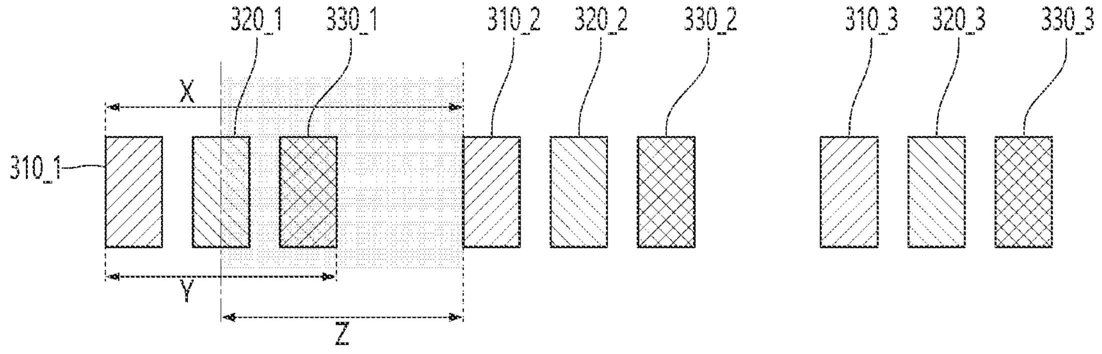

[FIG. 28]
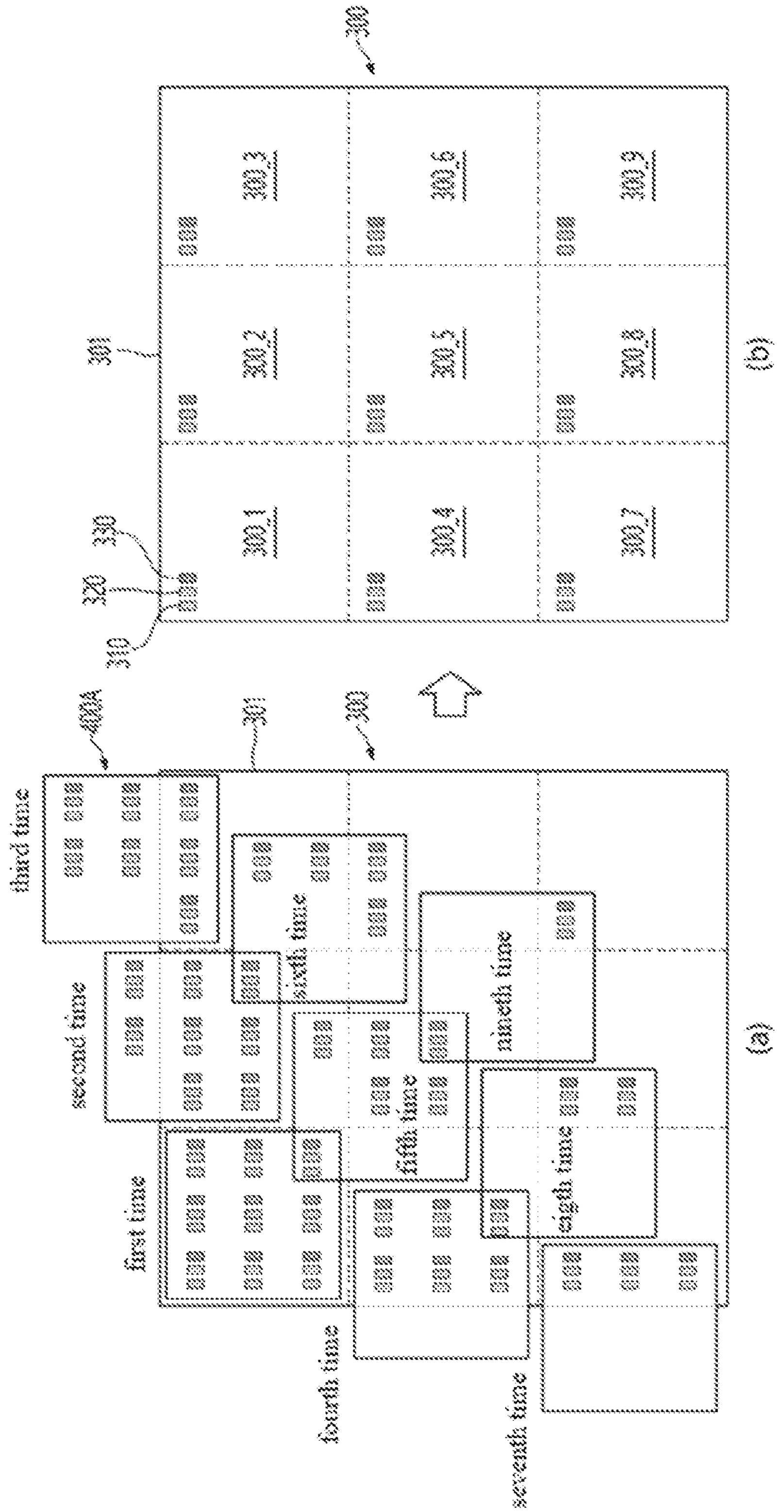

[FIG. 29]
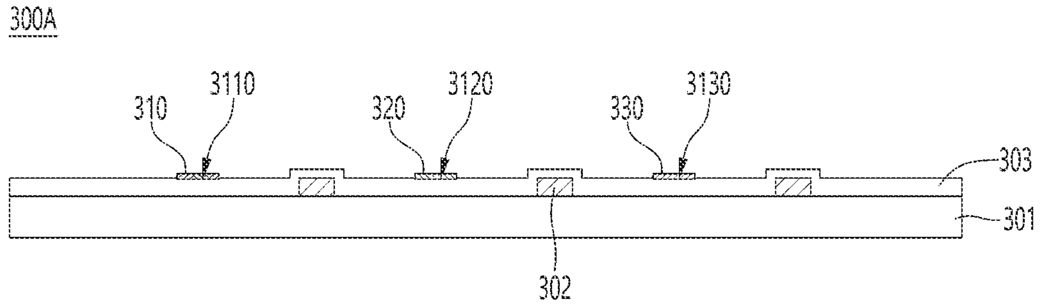
[FIG. 30]
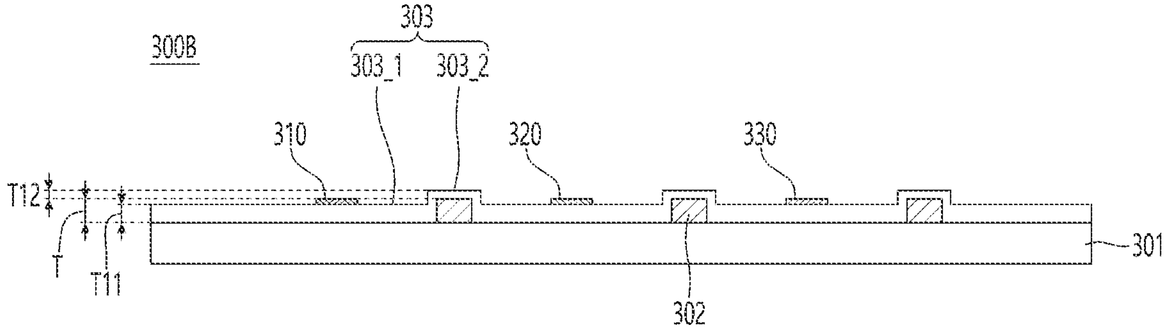
[FIG. 31]
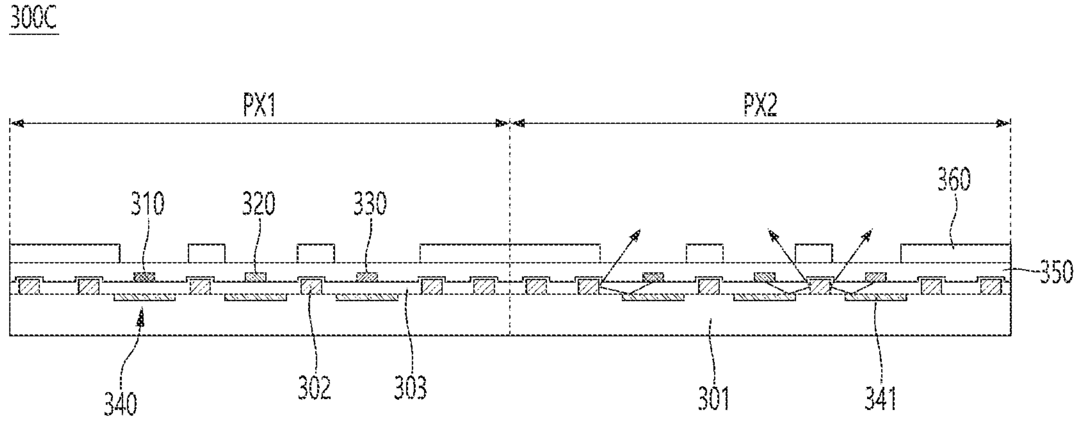

[FIG. 32]
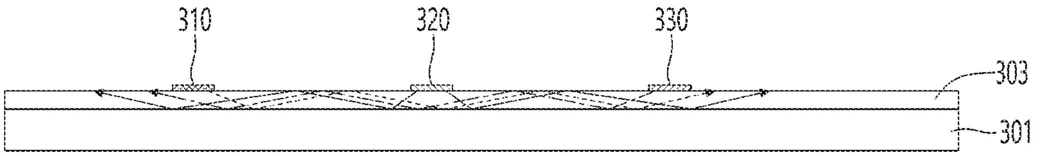
[FIG. 33]
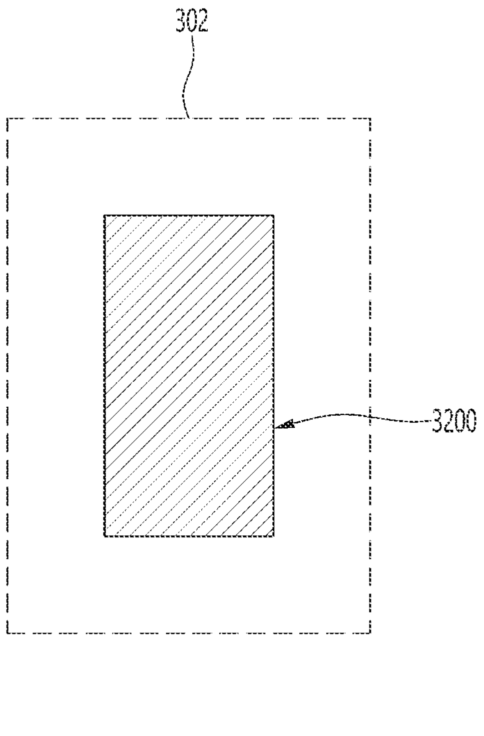

[FIG. 34]
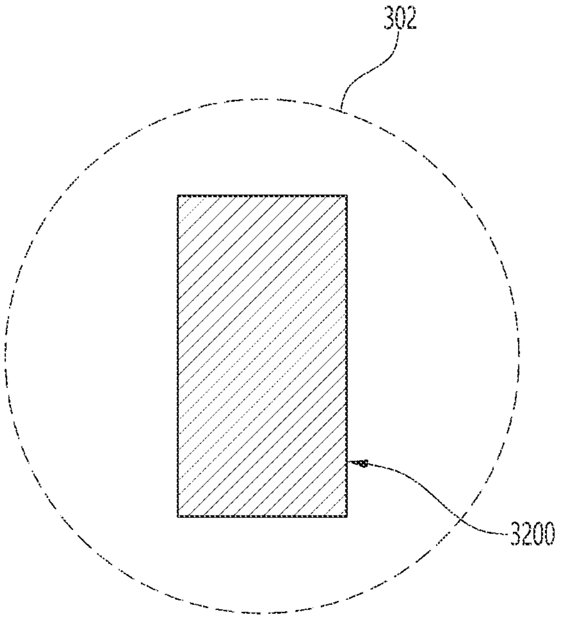
[FIG. 35]
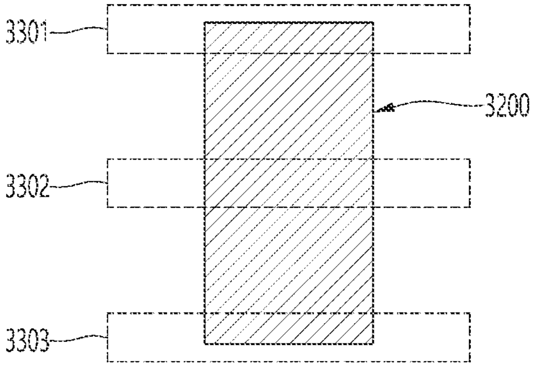

[FIG. 36]
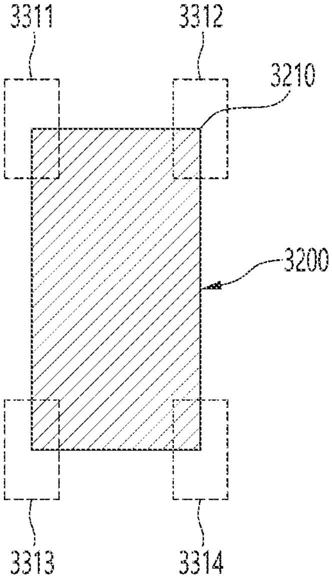
[FIG. 37]
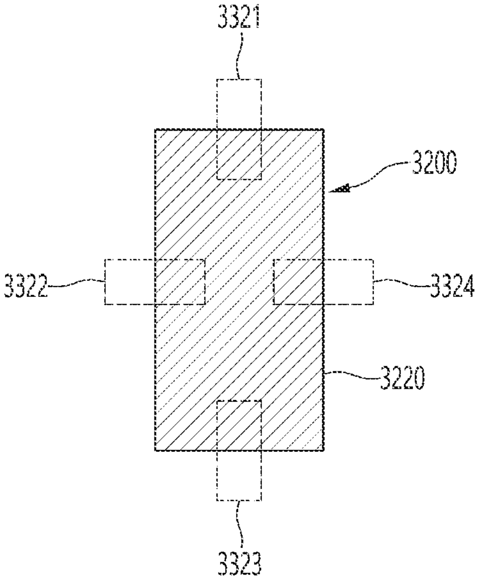

[FIG. 38]
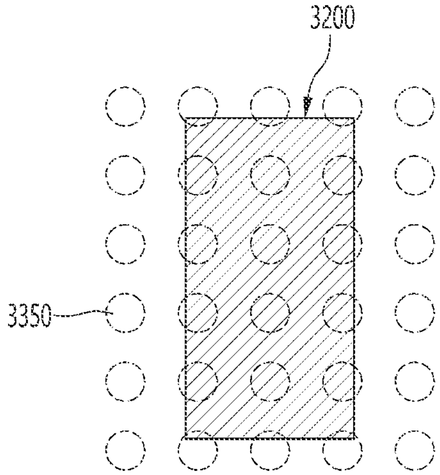

DISPLAY APPARATUS

CROSS-REFERENCE TO RELATED APPLICATION

Pursuant to 35 U.S.C. § 119(a), this application claims the benefit of an earlier filing date of and the right of priority to Korean Application No. 10-2021-0065784, filed on May 21, 2021, the entire contents of which are hereby expressly incorporated by reference into the present application.

BACKGROUND OF THE DISCLOSURE

1. Field of the Disclosure

The embodiment relates to a display device.

2. Background of the Related Art

A display device displays a high-quality image by using a self-luminous device such as a light emitting diode as a light source of a pixel. Light emitting diodes have excellent durability even in harsh environmental conditions, and have a long lifespan and high brightness, so they are spotlighted as a light source for next-generation display devices.

Recently, research has been conducted to arrange a semiconductor light emitting device using a highly reliable semiconductor material in a display panel and use the semiconductor light emitting device as a next-generation pixel light source. So, in order to implement a high resolution, the size of the pixel is gradually getting smaller, and the light emitting device needs to be aligned with the pixel of the smaller size. Therefore, research on the manufacture of a micro light emitting device as small as a micro or nano scale is being actively conducted.

A typical display panel contains millions of pixels. Accordingly, since it is very difficult to align the light emitting devices in each of the millions of small pixels, various studies on a method for aligning the light emitting devices in a display panel are being actively conducted in recent years.

As the size of light emitting devices decreases, transferring these light emitting devices onto a substrate is emerging as a very important problem to solve. Transfer technologies that have been recently developed include a pick and place process, a laser lift-off method, or a self-assembly method.

FIG. 1 describes a general pick and place method.

In general, a display device is manufactured by transferring a plurality of light emitting devices 13 onto a display substrate 30, and the plurality of light emitting devices 13 are manufactured on a wafer 1.

The distance between the light emitting devices 13 manufactured on the wafer 1 does not correspond to the distance between the pixels defined on the display substrate 30, the plurality of light emitting devices 13 on the wafer 1 need not be directly transferred onto the display substrate 30.

Accordingly, an interposer is provided, and the plurality of light emitting devices 13 on the wafer 1 can be transferred onto the display substrate 30 in consideration of the distance between pixels of the display substrate 30.

On the other hand, the display substrate 30 is gradually enlarged, in transferring the plurality of light emitting devices 13 to one interposer corresponding to the enlarged display substrate 30, there is a problem in that there are difficulties in many processes and the production yield is lowered. Accordingly, in consideration of the size of the conventional display substrate 30, the display substrate 30 is divided into a plurality of regions 30_1 to 30_9, a plurality of interposers 20_1 to 20_9 having sizes corresponding to each of the plurality of regions 30_1 to 30_9 are provided.

As shown in FIG. 1(*a*), a plurality of light emitting devices 13 are manufactured on a wafer 1 using a predetermined semiconductor process.

As shown in FIG. 1(*b*), the plurality of light emitting devices 13 on the wafer 1 can be transferred onto the plurality of interposers 20_1 to 20_9. In this case, an interval between each of the plurality of light emitting devices 13 transferred to each of the plurality of interposers 20_1 to 20_9 corresponds to an interval between pixels of the display substrate 30.

As shown in FIG. 1(*c*), the plurality of interposers 20_1 to 20_9 are sequentially moved to the display substrate 30, and the plurality of light emitting devices 13 are transferred onto the display substrate 30.

For example, the first interposer 20_1 moves to the display substrate 30, and the plurality of light emitting devices 13 of the first interposer 20_1 are transferred onto the first region 30_1 of the display substrate 30.

For example, the second interposer 20_2 moves to the display substrate 30 so that the plurality of light emitting devices 13 of the second interposer 20_2 are transferred onto the second region 30_2 of the display substrate 30. Thereafter, the second interposer 20_2 is moved to be reused.

In this way, the remaining interposers, for example, the third to ninth interposers 20_3 to 20_9 are also sequentially moved to the display substrate 30 so that the plurality of light emitting devices 13 are transferred onto the third to ninth regions 30_3 to 30_9 of the display substrate 30.

However, in the conventional transfer method, after a first movement process in which a plurality of interposers 20_1 to 20_9 are provided, and these interposers 20_1 to 20_9 are individually moved to the display substrate 30, a second movement process including a transfer process in which the semiconductor light emitting device 13 of the interposer 20_1 to 20_9 is transferred to each region 30_1 to 30_9 on the display substrate 30, and the corresponding interposers 20_1 to 20_9 are moved for reuse after transfer is required, so that mass production is impossible because the process takes a long time.

In particular, in FIG. 1, the red semiconductor light emitting device is described. In order to display an image, the green semiconductor light emitting device and the blue semiconductor light emitting device also require the same transfer method as shown in FIG. 1, so there is a problem in that the process time is significantly increased.

On the other hand, as the size of the light emitting element 30 in the display device 30 including the light emitting element 13 is miniaturized, the decrease in luminance becomes a big problem. For example, the smaller the size of the light emitting device, the smaller the region of the active layer (or light emitting layer) that generates light, this leads to lowering of luminance.

Accordingly, there is an urgent need for a method for improving the luminance in each pixel of the display device 30.

Meanwhile, in order to improve image quality in the display device 30, it is necessary to remove defects such as color mixing. In particular, since it is difficult to form a blocking member for blocking light between pixels as the light emitting device 30 is miniaturized, defects such as color mixing between adjacent light emitting devices are likely to occur. There is a problem in that color reproducibility is lowered due to defects such as color mixing.

SUMMARY OF THE DISCLOSURE

One object of the embodiment is to provide a display device capable of solving the above-mentioned problem and other problems.

Another object of the embodiment is to provide a display device capable of mass production.

Another object of the embodiment is to provide a display device capable of improving luminance.

Another object of the embodiment is to provide a display device capable of improving image quality.

The technical problems of the embodiment are not limited to those described in this item, and include those that can be grasped through the description of the invention.

According to an aspect of the embodiment to achieve the above or other objects, the display device can include a substrate including a plurality of pixels; a plurality of protrusions on the substrate; an adhesive layer on the substrate; and a plurality of semiconductor light emitting devices on the adhesive layer. The plurality of semiconductor light emitting devices can be disposed in each of the plurality of pixels, and the plurality of protrusions can be disposed around the plurality of semiconductor light emitting devices in the pixel.

The adhesive layer can include a first adhesive layer disposed on the substrate; and a second adhesive layer disposed on the protrusion, and a second thickness of the second adhesive layer can be smaller than a first thickness of the first adhesive layer.

Also, the plurality of protrusions can be arranged in a matrix within the pixel.

Also, the plurality of semiconductor light emitting devices can include a first semiconductor light emitting device, a second semiconductor light emitting device and a third semiconductor light emitting device.

Also, each of the plurality of pixels can include a first region in which the first semiconductor light emitting device is disposed; a second region in which the second semiconductor light emitting device is disposed; a third region in which the third semiconductor light emitting device is disposed; and a fourth area excluding the first area, the second area, and the third area.

Also, the plurality of protrusions can be disposed in the fourth area.

Also, the plurality of protrusions can be arranged at regular intervals in the fourth area.

Also, the first semiconductor light emitting device can include a red semiconductor light emitting device, the second semiconductor light emitting device can include a green semiconductor light emitting device, and the third semiconductor light emitting device can include a blue semiconductor light emitting device.

Also, the distance between each of the first to third semiconductor light emitting devices and the protrusions adjacent in one direction can be the same.

Also, the adhesive layer can include a first groove corresponding to the first area; a second groove corresponding to the second area; and a third groove corresponding to the third area.

Also, the first semiconductor light emitting device can be disposed in the first groove, the second semiconductor light emitting device can be disposed in the second groove, the third semiconductor light emitting device can be disposed in the third groove.

Also, a size of the protrusion can be equal to or greater than that of each of the semiconductor light emitting devices.

Also, the adhesive layer can include a first adhesive layer disposed on the substrate; and a second adhesive layer disposed on the protrusion.

Also, a second thickness of the second adhesive layer can be smaller than a first thickness of the first adhesive layer.

Also, a thickness of the protrusion can be at least ¼ times the first thickness of the first adhesive layer.

Also, the first adhesive layer can be disposed on a side circumference the protrusion.

Also, an upper surface of the protrusion can be located higher than that of the first adhesive layer, and each of the plurality of semiconductor light emitting devices can be horizontally overlapped with a portion of the protrusion.

Also, the embodiments can include a reflector disposed under the plurality of semiconductor light emitting devices.

Also, the reflector can include a reflective pattern disposed between the substrate and the adhesive layer.

Also, each of the plurality of protrusions comprises a plurality of bumps.

Also, the plurality of bumps can be disposed across a predetermined area corresponding to the sizes of the plurality of semiconductor light emitting devices.

Also, wherein the plurality of bumps can be disposed at corners of preset regions corresponding to sizes of the plurality of semiconductor light emitting devices.

Also, wherein the plurality of bumps can be disposed on sides of preset regions corresponding to sizes of the plurality of semiconductor light emitting devices.

The effect of the display device according to the embodiment will be described as follows.

According to at least one of the embodiments, there is a technical advantage in that the processing time can be significantly shortened. Referring to FIGS. 22 and 28, by sequentially transferring the semiconductor light emitting device to a plurality of partitioned regions of the display device 300 using one interposer 400, the process time can be significantly reduced. For example, in the related art, a plurality of interposers are provided, and the semiconductor light emitting devices are transferred to a plurality of partitioned areas of the display device by using each of the plurality of interposers. In this case, it is necessary to move each of the plurality of interposers from the outside to the corresponding partitioned area of the display device, to transfer the semiconductor light emitting device to the corresponding partitioned area, and to move the next process to reuse each of the corresponding interposers. So, the processing time would be significantly increased.

On the other hand, in the embodiment, after one interposer is moved to the display device, the semiconductor light emitting devices are transferred to the respective partitioned areas while moving to a plurality of adjacent partitioned areas, so the process time can be significantly reduced. As described above, as the process time is remarkably shortened, there is an advantage in that a display device can be mass-produced.

According to at least one of the embodiments, there is an advantage in that the number of interposers can be minimized, thereby reducing process costs.

According to at least one of the embodiments, by optimizing the arrangement of the semiconductor light emitting devices in the interposer, there is an advantage in that it is possible to transfer to more and more divided areas of the display device using one interposer, thereby further reducing the processing time.

According to at least one of the embodiments, there is an advantage that high-quality image quality can be secured by fundamentally blocking transfer defects.

As shown in FIGS. 11 and 29 to 31, a plurality of protrusions 302 can be disposed on the substrate 301 of the display devices 300, 300A, 300B, and 300C. The plurality of protrusions 302 can be disposed in a region 3040 of FIG. 13 of the substrate 301 corresponding to the semiconductor light emitting device to be not transferred in the interposer. Accordingly, when the interposer is pressed to a specific partitioned area of the substrate 301, since the semiconductor light emitting device to be transferred can be transferred to a specific partitioned area, and the semiconductor light emitting device not to be transferred is not transferred to the specific partitioned area by the plurality of protrusions 302 and the adhesive layer 303 disposed thereon, transfer failure can be fundamentally blocked.

For example, when a transfer failure occurs, a different number of semiconductor light emitting devices can be transferred to a plurality of partitioned regions of the substrate. In this case, each pixel in the partition region can also include a different number of semiconductor light emitting devices, so the luminance of each pixel can be different. For example, it is difficult to secure high-quality image quality due to non-uniform luminance of each pixel. Therefore, as in the embodiment, since the semiconductor light emitting devices that are not to be transferred to each compartment of the substrate are not transferred to the corresponding compartment, the same number of semiconductor light emitting devices are included in each pixel in each compartment, high-quality image quality can be secured because the luminance of each picture is uniform.

According to at least one of the embodiments, there is an advantage in that the fixability of the semiconductor light emitting device can be enhanced.

As shown in FIG. 29, a plurality of grooves 3110, 3120, 3130 are disposed on the adhesive layer 303, and the semiconductor light emitting devices 310, 320, 330 can be disposed therein. In this case, lower portions of each of the semiconductor light emitting devices 310, 320, 330 are inserted into the plurality of grooves 3110, 3120, and 3130 to contact the bottom and inner surfaces of the plurality of grooves 3110, 3120, and 3130, so it is possible to improve the fixability of the semiconductor light emitting devices 310, 320, 330.

According to at least one of the embodiments, there is an advantage in that the luminance can be improved by increasing the amount of light.

As shown in FIG. 31, the reflector 340 can be disposed under each of the semiconductor light emitting devices 310, 320, 330, so the light emitted from the semiconductor light emitting devices 310, 320, 330 can be reflected forward to improve luminance.

In addition, the plurality of protrusions 302 can be a blocking layer or a reflective layer. A plurality of protrusions 302 can be disposed on the adhesive layer 303 around the semiconductor light emitting devices 310, 320, 330.

When the plurality of protrusions 302 are the blocking layers, even if the light emitted from the semiconductor light emitting device 310, 320, 330 and entered into the adhesive layer 303 proceeds in the lateral direction, the propagation of the light is blocked by the protrusion 302, so it is possible to improve image quality by blocking generation of mixed-color light in which different color lights emitted from the semiconductor light emitting devices 310, 320, 330 are mixed.

When the plurality of protrusions 302 are reflective layers, the light emitted from the semiconductor light emitting devices 310, 320, 330 and entering the adhesive layer 303 is reflected forward by the plurality of protrusions, thereby improving luminance due to an increase in the amount of light.

Further scope of applicability of embodiments will become apparent from the following detailed description. However, it should be understood that the detailed description and specific embodiments, such as preferred embodiments, are given by way of example only, since various changes and modifications within the spirit and scope of the embodiments can be clearly understood by those skilled in the art.

BRIEF DESCRIPTION OF THE DRAWINGS

FIG. 1 describes a general pick-and-place method.

FIG. 2 illustrates a living room of a house in which the display device 100 according to the embodiment is disposed.

FIG. 3 is a block diagram schematically showing a display device according to an embodiment.

FIG. 4 is a circuit diagram illustrating an example of the pixel of FIG. 3.

FIG. 5 is a plan view illustrating the display panel of FIG. 3 in detail.

FIG. 6 is an enlarged view of a first panel area in the display device of FIG. 2.

FIGS. 7 and 8 are diagrams illustrating an example in which a light emitting device according to an embodiment is transferred to a substrate by a transfer method.

FIG. 9 is a cross-sectional view schematically illustrating the display panel of FIG. 3.

FIG. 10 is a plan view illustrating the display device according to the first embodiment.

FIG. 11 is a cross-sectional view illustrating the display device according to the first embodiment.

FIG. 12 is an enlarged view illustrating a region X of FIG. 11.

FIG. 13 shows a plurality of light emitting elements and protrusions disposed on a substrate.

FIG. 14 shows an interposer with a light emitting element to be transferred onto the substrate of FIG. 13.

FIG. 15 is a plan view illustrating an interposer according to the first embodiment.

FIG. 16 is a cross-sectional view taken along line A-B of FIG. 14.

FIG. 17 illustrates a state in which a light emitting element on an interposer is erroneously transferred onto a substrate.

FIG. 18 shows a state in which the light emitting device on the interposer of FIG. 15 is transferred to the first partition area of the substrate of FIG. 22.

FIG. 19 illustrates a state in which the light emitting device on the interposer of FIG. 15 is transferred to the second partitioned area of the substrate of FIG. 22.

FIG. 20 illustrates a state in which two light emitting devices are disposed in each sub-pixel of an interposer.

FIG. 21 illustrates a state in which three light emitting devices are disposed in each sub-pixel of an interposer.

FIG. 22 is a diagram illustrating a state in which one interposer is used to continuously transfer eight times.

FIG. 23 is a plan view illustrating an interposer according to a second embodiment.

FIG. 24 shows a state in which the light emitting device of the interposer of FIG. 23 is transferred to the first partitioned area of FIG. 28.

FIG. 25 shows a state in which the light emitting device of the interposer of FIG. 23 is transferred to the second partition area of FIG. 28.

FIG. 26 shows a state in which the light emitting device of the interposer of FIG. 23 is transferred to the third partitioned area of FIG. 28.

FIG. 27 illustrates a state in which three light emitting devices are disposed in sub-pixels of an interposer.

FIG. 28 shows a state of consecutively transferring nine times using one interposer.

FIG. 29 is a cross-sectional view illustrating a display device according to a second embodiment.

FIG. 30 is a cross-sectional view illustrating a display device according to a third embodiment.

FIG. 31 is a cross-sectional view illustrating a display device according to a fourth embodiment.

FIG. 32 shows a state in which color mixing occurs in the adhesive layer.

FIG. 33 is a plan view illustrating a first example of a protrusion.

FIG. 34 is a plan view illustrating a second example of the protrusion.

FIG. 35 is a plan view illustrating a third example of the protrusion.

FIG. 36 is a plan view illustrating a fourth example of the protrusion.

FIG. 37 is a plan view illustrating a fifth example of the protrusion.

FIG. 38 is a plan view illustrating a sixth example of the protrusion.

DETAILED DESCRIPTION OF THE DISCLOSURE

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. In addition, the accompanying drawings are provided for easy understanding of the embodiments disclosed in the present specification, and the technical spirit disclosed in the present specification is not limited by the accompanying drawings. Also, when an element, such as a layer, region, or substrate, is referred to as being 'on' another component, this includes that it is directly on the other element or there can be other intermediate elements in between.

The display device described in this specification can include a mobile phone, a smart phone, a laptop computer, terminals for digital broadcasting, a PDA (personal digital assistants), a PMP (portable multimedia player), a navigation, a Slate PC, a Tablet PC, a Ultrabook, a Digital TV, a Desktop Computer, etc. However, the configuration according to the embodiment described in the present specification can be applied to a display capable device even if it is a new product form to be developed later.

Hereinafter, a light emitting device according to an embodiment and a display device including the same will be described.

FIG. 2 shows a living room of a house in which the display device 100 according to the embodiment is disposed.

The display device 100 of the embodiment can display the status of various electronic products such as a washing machine 101, a robot cleaner 102, and an air purifier 103, and can communicate with each electronic product based on IOT, and can control each electronic product based on user's setting data.

The display device 100 according to the embodiment can include a flexible display manufactured on a thin and flexible substrate. The flexible display can be bent or rolled like paper while maintaining the characteristics of the conventional flat panel display.

In the flexible display, visual information can be implemented by independently controlling the light emission of unit pixels arranged in a matrix form. A unit pixel means a minimum unit for implementation of one color. The unit pixel of the flexible display can be implemented by a light emitting device. In an embodiment, the light emitting device can be a Micro-LED or a Nano-LED, but is not limited thereto.

FIG. 3 is a block diagram schematically showing a display device according to an embodiment, and FIG. 4 is a circuit diagram showing an example of the pixel of FIG. 3

Referring to FIGS. 3 and 4, the display device according to the embodiment can include a display panel 10, a driving circuit 20, a scan driving unit 30, and a power supply circuit 50.

The display device 100 of the embodiment can drive the light emitting device in an active matrix (AM) method or a passive matrix (PM) method.

The driving circuit 20 can include a data driver 21 and a timing controller 22.

The display panel 10 can have a rectangular shape, but is not limited thereto. For example, the display panel 10 can be formed in a circular or oval shape. At least one side of the display panel 10 can be formed to be bent to a predetermined curvature.

The display panel 10 can be divided into a display area DA and a non-display area NDA disposed around the display area DA. The display area DA is an area in which pixels PX are formed to display an image. The display panel 10 can include data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 emits a first color light of a first wave, the second sub-pixel PX2 emits a second color light of a second wave, and the third sub-pixel PX3 emits a third color light of a third wave. The first color light can be red light, the second color light can be green light, and the third color light can be blue light, but is not limited thereto. Also, although it is illustrated that each of the pixels PX can include three sub-pixels in FIG. 3, the present invention is not limited thereto. For example, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line. As shown in FIG. 4, the first sub-pixel PX1 can include the light emitting devices LD, plurality of transistors for supplying current to the light emitting devices LD, and at least one capacitor Cst.

Each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode The plurality of transistors can include a driving transistor DT for supplying current to the light emitting devices LD as shown in FIG. 4 and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst can charge a difference between the gate voltage and the source voltage of the driving transistor DT.

The driving transistor DT and the scan transistor ST can be formed of a thin film transistor. In addition, although the driving transistor DT and the scan transistor ST have been mainly described in FIG. 4 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 4, it is illustrated each of the first sub-pixel PX1, the second sub-pixel PX2, and the third sub-pixel PX3 can include one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Since the second sub-pixel PX2 and the third sub-pixel PX3 can be represented by substantially the same circuit diagram as the first sub-pixel PX1, a detailed description thereof will be omitted.

The driving circuit 20 outputs signals and voltages for driving the display panel 10. To this end, the driving circuit 20 can include a data driver 21 and a timing controller 22.

The data driver 21 receives digital video data and a source control signal DCS from the timing controller 22. The data driver 21 converts the digital video data into analog data voltages according to the source control signal DCS and supplies them to the data lines D1 to Dm of the display panel 10.

The timing controller 22 can receive digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The timing controller 22 can generate control signals for controlling the operation timings of the data driver 21 and the scan driver 30. The control signals can include a source control signal DCS for controlling an operation timing of the data driver 21 and a scan control signal SCS for controlling an operation timing of the scan driver 30.

The driving circuit 20 can be disposed in the non-display area NDA provided on one side of the display panel 10. The driving circuit 20 can be formed of an integrated circuit (IC) and can be mounted on the display panel 10 by a chip on glass (COG) method, a chip on plastic (COP) method, or an ultrasonic bonding method, but the present invention is not limited thereto. For example, the driving circuit 20 can be mounted on a circuit board instead of the display panel 10.

The data driver 21 can be mounted on the display panel 10 by a chip on glass (COG) method, a chip on plastic (COP) method, or an ultrasonic bonding method, and the timing controller 22 can be mounted on a circuit board.

The scan driver 30 can receive the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The circuit board can be attached on pads provided on one edge of the display panel 10 using an anisotropic conductive film. Due to this, the lead lines of the circuit board can be electrically connected to the pads. The circuit board can be a flexible film such as a flexible printed circuit board, a printed circuit board or a chip on film. The circuit board can be bent under the display panel 10. For this reason, one side of the circuit board can be attached to one edge of the display panel 10, and the other side can be disposed under the display panel 10 to be connected to a system board on which a host system is mounted.

The power supply circuit 50 can generate voltages necessary for driving the display panel 10 from the main power applied from the system board and supply the voltages to the display panel 10. For example, the power supply circuit 50 can generate a high potential voltage VDD and a low potential voltage VSS for driving the light emitting devices LD of the display panel 10 from the main power source, and can supply the high potential voltage line and the low potential voltage line of the display panel 10.

FIG. 5 is a plan view showing the display panel of FIG. 3 in detail. In the FIG. 7, for convenience of description, Data pads DP1 to DPp, where p is an integer greater than or equal to 2), floating pads FP1 and FP2, power pads PP1 and PP2, floating lines FL1 and FL2, low potential voltage line VSSL, data lines D1 to Dm, the first pad electrodes 210 and the second pad electrodes 220 are illustrated.

Referring to FIG. 5, data lines D1 to Dm, first pad electrodes 210, second pad electrodes 220, and pixels PX can be disposed in the display area DA of the display panel 10.

The data lines D1 to Dm can extend long in the second direction (Y-axis direction). One side of the data lines D1 to Dm can be connected to the driving circuit 20 of FIG. 5. Accordingly, the data voltages of the driving circuit 20 can be applied to the data lines D1 to Dm.

The first pad electrodes 210 can be disposed to be spaced apart from each other at a predetermined interval in the first direction (X-axis direction). Accordingly, the first pad electrodes 210 may not overlap the data lines D1 to Dm. Among the first pad electrodes 210, the first pad electrodes 210 disposed at the right edge of the display area DA can be connected to the first floating line FL1 in the non-display area NDA.

Each of the second pad electrodes 220 can extend in a first direction (X-axis direction). Accordingly, the second pad electrodes 220 can overlap the data lines D1 to Dm. Also, the second pad electrodes 220 can be connected to the low potential voltage line VSSL in the non-display area NDA. Accordingly, the low potential voltage of the low potential voltage line VSSL can be applied to the second pad electrodes 220.

In the non-display area NDA of the display panel 10, a pad part PA, a driving circuit 20, a first floating line FL1, a second floating line FL2, and a low potential voltage line VSSL can be disposed. The pad part PA can include data pads DP1 to DPp, floating pads FP1 and FP2, and power pads PP1 and PP2.

The pad part PA can be disposed on one edge of the display panel 10, for example, a lower edge. The data pads DP1 to DPp, the floating pads FP1 and FP2, and the power pads PP1 and PP2 can be disposed in parallel in the first direction (X-axis direction) in the pad part PA.

A circuit board can be attached to the data pads DP1 to DPp, the floating pads FP1 and FP2, and the power pads PP1 and PP2 using an anisotropic conductive film. Accordingly, the circuit board and the data pads DP1 to DPp, the floating pads FP1 and FP2, and the power pads PP1 and PP2 can be electrically connected to each other.

The driving circuit 20 can be connected to the data pads DP1 to DPp through link lines. The driving circuit 20 can receive digital video data DATA and timing signals through the data pads DP1 to DPp. The driving circuit 20 can convert the digital video data DATA into analog data voltages and supply the converted digital video data DATA to the data lines D1 to Dm of the display panel 10.

The low potential voltage line VSSL can be connected to the first power pad PP1 and the second power pad PP2 of the pad part PA. The low potential voltage line VSSL can extend long in the second direction (Y-axis direction) in the non-display area NDA at the left outer side and the right outer side of the display area DA. The low potential voltage line VSSL can be connected to the second pad electrode 220. Due to this, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FP1 of the pad part PA. The first floating line FL1 can extend long in the second direction (Y-axis direction) in the non-display area NDA on the left and right sides of the display area DA. The first floating pad FP1 and the first floating line FL1 can be a dummy pad and a dummy line to which no voltage is applied.

The second floating line FL2 can be connected to the second floating pad FP2 of the pad part PA. The first floating line FL1 can extend long in the second direction (Y-axis direction) in the non-display area NDA on the left and right sides of the display area DA. The second floating pad FP2 and the second floating line FL2 can be a dummy pad and a dummy line to which no voltage is applied.

Meanwhile, since the light emitting devices (LDs of FIG. 4) have a very small size, it is very difficult to mount on the first sub-pixel PX1, the second sub-pixel PX2, and the third sub-pixel PX3 of each of the pixels PXs.

To solve this problem, an alignment method using a dielectrophoresis method has been proposed.

For example, during the manufacturing process of the display panel 10, in order to align the light emitting devices (310, 320, 330 of FIG. 14), an electric field can be formed in the first sub-pixel PX1, the second sub-pixel PX2, and the third sub-pixel PX3 of each of the pixels PXs. Specifically, by applying a dielectrophoretic force to the light emitting devices 310, 320, 330 using a dielectrophoretic method during the manufacturing process, the light emitting devices 310, 320, 330 can be aligned in each of the first sub-pixel PX1, the second sub-pixel PX2, and the third sub-pixel PX3.

However, it is difficult to apply a ground voltage to the first pad electrodes 210 by driving the thin film transistors during the manufacturing process.

Therefore, in the completed display device, the first pad electrodes 210 can be disposed spaced apart from each other at a predetermined interval in the first direction (X-axis direction). But, during the manufacturing process, the first pad electrodes 210 can be disposed to extend long without being disconnected in the first direction (X-axis direction).

Accordingly, during the manufacturing process, the first pad electrodes 210 can be connected to the first floating line FL1 and the second floating line FL2. Therefore, the first pad electrodes 210 can receive a ground voltage through the first floating line FL1 and the second floating line FL2. Therefore, after aligning the light emitting devices 310, 320, 330 using the dielectrophoretic method during the manufacturing process, by disconnecting the first pad electrodes 210, the first pad electrodes 210 can be disposed to be spaced apart from each other at a predetermined interval in the first direction (X-axis direction).

Meanwhile, the first floating line FL1 and the second floating line FL2 are lines for applying a ground voltage during a manufacturing process, and no voltage can be applied to the completed display device. Alternatively, a ground voltage can be applied to the first floating line FL1 and the second floating line FL2 to prevent static electricity in the completed display device or to drive the light emitting devices 310, 320, 330.

FIG. 6 is an enlarged view of a first panel area in the display device of FIG. 2.

Referring to FIG. 6, the display device 100 according to the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 3).

For example, the unit pixel PX can include a first sub-pixel PX1, a second sub-pixel PX2, and a third sub-pixel PX3. For example, a plurality of red light emitting devices 150R can be disposed in the first sub-pixel PX1, A plurality of green light-emitting devices 150G can be disposed in the second sub-pixel PX2, and a plurality of blue light-emitting devices 150B can be disposed in the third sub-pixel PX3. The unit pixel PX can further include a fourth sub-pixel in which a light emitting device is not disposed, but is not limited thereto.

Meanwhile, the light emitting device 150 can be the semiconductor light emitting device 310, 320, 330 of FIG. 14. For example, the first semiconductor light emitting device 310 can be a red light emitting device 150R, the second semiconductor light emitting device 320 can be a green light emitting device 150G, and the third semiconductor light emitting device 330 can be a blue light emitting device 150B.

Meanwhile, a method of mounting the light emitting device 150 on the substrate 200 can include, for example, a self-assembly method and a transfer method (FIGS. 7 and 8).

FIGS. 7 and 8 are diagrams illustrating an example in which a light emitting device according to an embodiment is transferred to a substrate by a transfer method.

As shown in FIG. 7, a plurality of light emitting devices 150 can be attached to a substrate 1500. For example, the substrate 1500 can be a donor substrate as an intermediate medium for mounting the light emitting device 150 on the display substrate. In this case, the plurality of light emitting devices 150 manufactured on the wafer can be attached to the substrate 1500, and the plurality of light emitting devices 150 attached to the substrate 1500 can be transferred onto the display substrate.

Hereinafter, the substrate 1500 as a donor substrate will be described, but the substrate 1500 can be a display substrate to which the plurality of light emitting devices 150 are directly transferred without passing through the donor substrate.

As shown in FIG. 7, after the substrate 1500 is positioned on the display substrate 200, an alignment process can be performed so that each of the plurality of light emitting devices 150 on the substrate 1500 corresponds to each pixel of the display substrate 200.

Thereafter, by pressing the substrate 1500 (or the substrate 200 for display), the plurality of light emitting devices 150 on the substrate 1500 can be transferred to each pixel on the substrate 200 for display.

Thereafter, a plurality of light emitting devices 150 are attached to the display substrate 200 through a post-process and the plurality of light emitting devices 150 are electrically connected to a power source, so that the plurality of light emitting devices 150 can emit light to display an image.

Meanwhile, in the display device according to the embodiment, an image can be displayed using a light emitting device. The light emitting device of the embodiment is a self-emitting device that emits light by itself by application of electricity, and can be a semiconductor light emitting device. Since the light emitting device of the embodiment is made of an inorganic semiconductor material, it is resistant to deterioration and has a semi-permanent lifespan, thereby providing stable light, thereby contributing to the implementation of high-quality and high-definition images in the display device.

For example, the display device can display an image by using a light emitting element as a light source and having a color generating unit on the light emitting element (FIG. 9).

The display device can display the projection through a display panel in which each of a plurality of light emitting devices generating different color light is disposed in a pixel.

FIG. 9 is a cross-sectional view schematically showing the display panel of FIG. 3.

Referring to FIG. 9, the display panel 10 according to the embodiment can include a first substrate 40, a light emitting unit 41, a color generating unit 42, and a second substrate 46. The display panel 10 of the embodiment can include more components than this, but is not limited thereto.

At least one insulating layer can be disposed between the first substrate 40 and the light emitting unit 41, between the light emitting unit 41 and the color generating unit 42 and/or between the color generating unit 42 and the second substrate 46, but, the present invention is not limited thereto.

The first substrate 40 can support the light emitting unit 41, the color generating unit 42, and the second substrate 46. The first substrate 40 can include various elements as described above, for example, data lines D1 to Dm (m is an integer of 2 or more), scan lines S1 to Sn, a high potential voltage line and a low potential voltage line, a plurality of transistors ST and DT, at least one capacitor Cst, and a first pad electrode 210, a second pad electrode 220.

The first substrate 40 can be formed of glass or a flexible material, but is not limited thereto.

The light emitting unit 41 can provide light to the color generating unit 42. The light emitting unit 41 can include a plurality of light sources that emit light by themselves by application of electricity. For example, the light source can include a light emitting device (150 in FIG. 6 and 310, 320, 330 in FIG. 11).

For example, the plurality of light emitting devices 150 can be separately arranged for each sub-pixel of a pixel, and can emit light independently under the control of each individual sub-pixel.

As another example, the plurality of light emitting devices 150 can be disposed irrespective of the division of the pixels to simultaneously emit light in all sub-pixels.

The light emitting device 150 of the embodiment can emit blue light, but is not limited thereto. For example, the light emitting device 150 of the embodiment can emit white light or purple light.

Meanwhile, the light emitting device 150 can emit red light, green light, and blue light for each sub-pixel. For this purpose, for example, a red light emitting device emitting red light can be disposed in the first sub-pixel, for example, the red sub-pixel. Also, a green light emitting device emitting green light can be disposed in the second sub-pixel, for example, the green sub-pixel. Also, and a blue light emitting device emitting blue light can be disposed in the third sub-pixel, for example, the blue sub-pixel.

For example, each of the red light emitting device, the green light emitting device, and the blue light emitting device can include a group II-IV compound or a group III-V compound, but is not limited thereto. For example, group III-V compounds can be selected from the group consisting of a diatomic compound selected from the group consisting of GaN, GaP, GaAs, GaSb, AlN, AlP, AlAs, AlSb, InN, InP, InAs, InSb and mixtures thereof, ternary compounds selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof, and quaternary compounds selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The color generating unit 42 can generate a color light different from the light provided by the light emitting unit 41.

For example, the color generator 42 can include a first color generator 43, a second color generator 44, and a third color generator 45. The first color generator 43 corresponds to the first sub-pixel PX1 of the pixel, the second color generator 44 corresponds to the second sub-pixel PX2 of the pixel, and the third color generator 45 can correspond to the third sub-pixel PX3 of the pixel.

The first color generating unit 43 can generate a first color light based on the light provided from the light emitting unit 41, the second color generating unit 44 can generate a second color light based on the light provided from the light emitting unit 41, and the third color generating unit 45 can generate third color light based on the light provided from the light emitting unit 41. For example, the first color generating unit 43 outputs the blue light of the light emitting unit 41 as red light, the second color generating unit 44 outputs the blue light of the light emitting unit 41 as green light, and the third color generating unit 45 can output the blue light from the light emitting unit 41 as it is.

As an example, the first color generator 43 can include a first color filter, the second color generator 44 can include a second color filter, and the third color generator 45 can include a third color filter.

The first color filter, the second color filter, and the third color filter can be formed of a transparent material that allows light to penetrate.

For example, at least one of the first color filter, the second color filter, and the third color filter can include quantum dots.

The quantum dots of the embodiment can be selected from a group II-IV compound, a group III-V compound, a group IV-VI compound, a group IV element, a group IV compound, and combinations thereof.

Group II-VI compounds can be selected from the group consisting of a binary compound selected from the group consisting of CdSe, CdTe, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

Group III-V compounds can be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and mixtures thereof, and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

Group IV-VI compounds can be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof.

The group IV element can be selected from the group consisting of Si, Ge, and mixtures thereof. The group IV compound can be a binary compound selected from the group consisting of SiC, SiGe, and mixtures thereof.

Such quantum dots can have a full width of half maximum (FWHM) of an emission wave spectrum of about 45 nm or less, and light emitted through the quantum dots can be emitted in all directions. Accordingly, the viewing angle of the light emitting display device can be improved.

On the other hand, quantum dots can have the form of spherical, pyramidal, multi-arm, or cubic nanoparticles, nanotubes, nanowires, nanofibers, nano-platelet particles, etc. However, the present invention is not limited thereto.

For example, when the light emitting device 150 emits blue light, the first color filter can include red quantum dots, and the second color filter can include green quantum dots. The third color filter may not include quantum dots, but is not limited thereto. For example, blue light from the light emitting device 150 can be absorbed by the first color filter, and the absorbed blue light can be wave-shifted by red quantum dots to output red light. For example, blue light from the light emitting device 150 can be absorbed by the second color filter, and the absorbed blue light can be wave-shifted by green quantum dots to output green light. For example, blue light from the light emitting device can be absorbed by the third color filter, and the absorbed blue light can be emitted as it is.

Meanwhile, when the light emitting device 150 is white light, not only the first color filter and the second color filter, but also the third color filter can include quantum dots. For example, the wave of white light from the light emitting device 150 can be shifted to blue light by the quantum dots included in the third color filter.

For example, at least one of the first color filter, the second color filter, and the third color filter can include a phosphor. For example, some color filters among the first color filter, the second color filter, and the third color filter can include quantum dots, and others can include a phosphor. For example, each of the first color filter and the second color filter can include a phosphor and quantum dots. For example, at least one of the first color filter, the second color filter, and the third color filter can include scattering particles. Since blue light incident to each of the first color filter, the second color filter, and the third color filter is scattered by the scattering particles and the scattered blue light is color-shifted by the corresponding quantum dots, light output efficiency can be improved.

As another example, the first color generator 43 can include a first color conversion layer and a first color filter. The second color generator 44 can include a second color conversion and a second color filter. The third color generator 45 can include a third color conversion layer and a third color filter. Each of the first color conversion layer, the second color conversion layer, and the third color conversion layer can be disposed adjacent to the light emitting unit 41. The first color filter, the second color filter, and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can be in contact with the upper surface of the first color conversion layer and can have the same size as the first color conversion layer, but the present invention is not limited thereto. For example, the second color filter can be in contact with the upper surface of the second color conversion layer and can have the same size as the second color conversion layer, but is not limited thereto. For example, the third color filter can be in contact with the upper surface of the third color conversion layer and can have the same size as the third color conversion layer, but is not limited thereto.

For example, the first color conversion layer can include red quantum dots, and the second color conversion layer can include green quantum dots. The third color conversion layer may not include quantum dots. For example, the first color filter can include a red-based material that selectively transmits the red light converted by the first color conversion layer, the second color filter can include a green-based material that selectively transmits the green light converted in the second color conversion layer, the third color filter can include a blue-based material that selectively transmits the blue light transmitted as it is from the third color conversion layer.

Meanwhile, when the light emitting device 150 is white light, not only the first color conversion layer and the second color conversion layer, but also the third color conversion layer can include quantum dots. For example, the wave of white light from the light emitting device 150 can be shifted to blue light by the quantum dots included in the third color filter.

Referring back to FIG. 9, the second substrate 46 can be disposed on the color generator 42 to protect the color generator 42. The second substrate 46 can be formed of glass, but is not limited thereto.

The second substrate 46 can be referred to as a cover window, a cover glass, or the like.

The second substrate 46 can be formed of glass or a flexible material, but is not limited thereto.

On the other hand, in the embodiment, since a plurality of successive transfers are possible using one interposer, the semiconductor light emitting device can be transferred to a plurality of partitioned regions of the substrate of the display device, thereby remarkably shortening the process time. For such continuous transfer, a plurality of semiconductor light emitting devices provided in the interposer can be arranged by various methods (refer to FIGS. 15 and 23).

In addition, in the embodiment, in the interposer, in the region corresponding to the pixel defined on the substrate of the display device, a semiconductor light emitting device to be transferred to a specific partitioned area of the substrate as well as a semiconductor light emitting device to be transferred to another partitioned area can be arranged. In this case, when transferring to a specific partitioned area of the substrate using an interposer, a semiconductor light emitting device that are not to be transferred to the specific partitioned area can be also transferred to the specific partitioned area, which can cause poor transfer.

In order to solve such a transfer defect, a plurality of protrusions can be disposed on the substrate of the display device. The plurality of protrusions can be disposed in an area of the substrate corresponding to the semiconductor light emitting device not to be transferred in the interposer. Therefore, when the interposer is pressed to a specific compartmental area of the substrate, the semiconductor light emitting device to be transferred is transferred to a specific partitioned area, and the semiconductor light emitting device not to be transferred need not be transferred to the specific partitioned area by the plurality of protrusions and the adhesive layer disposed thereon, so that transfer failure can be fundamentally blocked.

Hereinafter, various aspects of the embodiment will be described in detail.

FIG. 10 is a plan view showing the display device according to the first embodiment.

FIG. 11 is a cross-sectional view illustrating the display device according to the first embodiment.

As shown in FIGS. 10 and 11, the display device 300 according to the first embodiment can include a substrate 301, a plurality of protrusions 302, an adhesive layer 303, and a plurality of semiconductor light emitting devices 310, 320, 330.

In FIGS. 10 and 11, 300_1 to 300_16 are partitioned areas corresponding to the size of the interposer (400 in FIGS. 15 and 400A in FIG. 23), and as one interposer 400 sequentially moves to the plurality of partitioned areas 300_1 to 300_16 of the substrate 301, the plurality of semiconductor light emitting devices 310, 320 and 330 of the interposer 400 can be transferred to the corresponding partitioned area 300_1 to 300_16. A transfer method using one interposer 400 will be described in detail later.

The substrate 301 can be a panel substrate or a display substrate of the display device 300. The substrate 301 can be referred to as a panel, a display panel, a base substrate, a backplane substrate, or the like, and these terms can be used interchangeably.

The substrate 301 can be a rigid substrate, a flexible substrate, a stretchable substrate, a rollable substrate, or the like.

The substrate 301 can be formed of glass or polyimide. Also, the substrate 301 can include a flexible material such as polyethylene naphthalate (PEN) or polyethylene terephthalate (PET). In addition, the substrate 3010 can be made of a transparent material, but is not limited thereto.

Various circuits and transistors can be provided on the substrate 301 as shown in FIGS. 4 and 5. The substrate 301 can be referred to as a backplane, but is not limited thereto. The substrate 301 can be composed of various layers.

The substrate 301 can include a plurality of pixels PX. As shown in FIG. 3, a plurality of pixels PX can be defined by the intersection of the scan lines S1 to Sn and the data lines D1 to Dm. A plurality of semiconductor light emitting devices 310, 320, 330 can be disposed in each of the pixels PX. A pixel column for one line is selected by the scan signal supplied to the scan lines S1 to Sn, and the semiconductor light emitting devices 310, 320, 330 disposed in the pixel column of the selected one line can emit light by the data voltage supplied to each of the data lines D1 to Dm, and an image can be displayed. In this way, a pixel column for every line is selected, an image of the selected pixel column is displayed, and an image of one frame can be displayed. In this way, an image is displayed in units of every frame, so that the moving image can be reproduced.

Meanwhile, the plurality of protrusions 302 can be disposed on the substrate 301. The protrusion 302 can have a shape protruding upward in contrast to the upper surface of the substrate 301. The protrusion 302 can be referred to as an extension portion, a pattern, a transfer preventing portion, and the like, and these terms can be used interchangeably. As will be described later, the transfer preventing unit can mean preventing the semiconductor light emitting device that are not to be transferred from the interposer 400 to the substrate 301 from being transferred to the substrate 301.

For example, the protrusion 302 can be integrally formed with the substrate 301. For example, the protrusion can include the same material as that of the substrate 301. For example, the protrusion 302 can be formed by partially etching the substrate 301. For example, the protrusion 302 can be formed of glass or polyimide. In addition, the protrusion 302 can include a flexible material such as polyethylene naphthalate (PEN) or polyethylene terephthalate (PET). In addition, the protrusion 302 can be made of a transparent material, but is not limited thereto.

As another example, the protrusion 302 can be formed separately from the substrate 301. For example, the protrusion 302 can include a material different from that of the substrate 301. For example, the protrusion 302 can be formed on the substrate 301 using a material different from that of the substrate 301. For example, the protrusion 302 can include a metal, an oxide material, an inorganic material, an organic material, or the like.

As described above, various layers are formed on the substrate 301, and the protrusion 302 can be formed using one of the various layers. For example, when the scan lines S1 to Sn or the data lines D1 to Dm shown in FIG. 3 are formed, the protrusion 302 can be formed together. For example, when forming the inorganic or organic layer on the substrate 301, the protrusion 302 can be formed using the inorganic or organic layer, The plurality of protrusions 302 can be disposed around the plurality of semiconductor light emitting devices 310, 320, 330.

For example, as shown in FIG. 13, a plurality of protrusions 302 can be arranged in a matrix in each of the pixels PX1 to PX4. For example, the plurality of protrusions 302 can be arranged in the horizontal direction and also in the vertical direction in the pixels PX1 to PX4.

The plurality of protrusions 302 can serve to prevent the semiconductor light emitting device (310_2, 320_2, 330_2 in FIG. 18) that are not to be transferred from the interposer (400 in FIG. 18) to the substrate 301 from being transferred to the substrate 301 during the transfer process.

The plurality of protrusions 302 can be disposed at corresponding positions on the substrate 301 corresponding to semiconductor light emitting devices (310_2, 320_2, 330_2 in FIG. 18) that are not to be transferred from the interposer 400 to the substrate 301 during the transfer process.

For example, when twenty-four semiconductor light emitting devices are provided in an area corresponding to the first pixel PX1 in the interposer (400 in FIG. 18), only three semiconductor light emitting devices 310_1, 320_1, and 330_1 should be disposed in the first pixel PX1 on the substrate 301, while the remaining 21 semiconductor light emitting devices are not to be transferred to the first pixel on the substrate 301.

The protrusion 302 can be disposed at a corresponding position in the first pixel PX1 of the substrate 301 corresponding to each of the remaining 21 semiconductor light emitting devices of the interposer 400. For example, as the twenty-one protrusions 302 in the first pixel PX1 of the substrate 301 are disposed to correspond to each of the remaining twenty-one semiconductor light emitting devices of the interposer 400 among the twenty four semiconductor light emitting devices of the interposer 400, only three semiconductor light emitting devices 310_1, 320_1, and 330_1 can be transferred into the first pixel PX1 on the substrate 301, and the remaining twenty-one semiconductor light emitting devices may not be transferred.

In the embodiment, transfer failure due to undesired semiconductor light emitting devices being transferred into the pixels PX1 to PX4 on the substrate 301 can be prevented. For example, in the case where ten semiconductor light emitting devices are transferred to one pixel on the substrate 301 and five semiconductor light emitting devices are transferred to another pixel, desired image quality can be obtained due to luminance imbalance between pixels. Therefore, in the embodiment, it is possible to secure high-quality image quality by fundamentally blocking transfer failure.

Meanwhile, as described above, the protrusion 302 can prevent the semiconductor light emitting devices 310_2, 320_2, and 330_2 of FIG. 18 not to be transferred from the interposer 400 of FIG. 18 to the substrate 301 during the transfer process from being transferred to the substrate 301. To this end, the size of the protrusion 302 can be the same as or greater than the size of the semiconductor light emitting devices 310, 320, 330. Since the size of the protrusion 302 is the same as or larger than the size of the semiconductor light emitting device 310, 320 and 330, the semiconductor light emitting device 310_2, 320_2, 330_2 in FIG. 18 not to be transferred to the substrate 301 may not be transferred to the substrate 301 by the corresponding protrusion 302. Meanwhile, the size of the protrusion 302 can be smaller than the size of the semiconductor light emitting devices 310, 320, 330.

The projection 302 of the embodiment will be described in detail later.

Meanwhile, the adhesive layer 303 can be disposed on the substrate 301. The adhesive layer 303 can make the plurality of semiconductor light emitting devices 310, 320, 330 on the interposer 400 be easily transferred to the substrate 301.

The adhesive layer 303 can be made of a material having excellent adhesive performance. For example, the adhesive layer 303 can be formed of a photo-hardening material that responds to light. During the transfer process, a light source such as ultraviolet light can be irradiated onto a rear surface of the substrate 301 to selectively transfer the plurality of light emitting devices of the interposer 400. For example, when the photo-hardening material is a positive photo-hardening material, UV rays are irradiated to a specific area of the substrate 301 that needs to be transferred from the interposer 400 to the substrate 301 to change the adhesive layer 303 on the substrate 301 to non-curable, the desired semiconductor light emitting devices 310, 320, 330 can be transferred to a specific region of the substrate 301.

The adhesive layer 303 can be disposed not only on the substrate 301 but also on the protrusion 302. In this case, the thickness of the adhesive layer 303 can vary depending on the presence or absence of the protrusion 302.

As shown in FIG. 12, the adhesive layer 303 can include a first adhesive layer 303_1 disposed on the substrate 301 and a second adhesive layer 303_2 disposed on the protrusion 302.

In this case, the second thickness T12 of the second adhesive layer 303_2 can be smaller than the first thickness T11 of the first adhesive layer 303_1. For example, when the adhesive material for forming the adhesive layer 303 is formed over the entire region of the substrate 301, most of the adhesive material is formed on the substrate 301, and since the area of the upper surface of the protrusion 302 is very small, the adhesive material positioned on the upper surface of the protrusion 302 can move onto the surrounding substrate 301. Accordingly, the second thickness T12 of the second adhesive layer 303_2 can be smaller than the first thickness T11 of the first adhesive layer 303_1. For example, when the adhesive material is not formed on the protrusion 302, the second thickness T12 can be zero.

On the other hand, as described above, the protrusion 302 can prevent the semiconductor light emitting devices (310_2, 320_2, and 330_2 of FIG. 18) that are not to be transferred from the interposer 400 of FIG. 18 to the substrate 301 during the transfer process from being transferred to the substrate 301. This role can also be performed by the second adhesive layer 303_2 disposed on the protrusion 302.

The second thickness T12 of the second adhesive layer 303_2 can also vary according to the thickness T of the protrusion 302. For example, the thickness T of the protrusion 302 and the second thickness T12 of the second adhesive layer 303_2 can have an inverse relationship. For example, as the thickness T of the protrusion 302 increases, the second thickness T12 of the second adhesive layer 303_2 decreases, as the thickness T of the protrusion 302 decreases, the second thickness T12 of the second adhesive layer 303_2 can increase.

For example, the thickness T of the protrusion 302 can be at least a quarter of the first thickness T11 of the first adhesive layer 303_1. When the thickness T of the protrusion 302 is less than a quarter of the first thickness T11 of the first adhesive layer 303_1, the second thickness T12 of the second adhesive layer 303_2 can be increased. When the second thickness T12 of the second adhesive layer 303_2 increases, the semiconductor light emitting devices 310_2, 320_2, and 330_2 of FIG. 18 that are not to be transferred from the interposer 400 of FIG. 18 to the substrate 301 can be transferred to the substrate 301, which can cause transfer failure.

For example, the thickness T of the protrusion 302 can be equal to or greater than the first thickness T11 of the first adhesive layer 303_1. In this case, since the second adhesive layer 303_2 is not formed on the protrusion 302, the second thickness T12 of the second adhesive layer 303_2 can be zero or can have a very fine thickness. As such, as the second thickness T12 of the second adhesive layer 303_2 is minimized, the semiconductor light emitting devices (310_2, 320_2, and 330_2 of FIG. 18) that are not to be transferred from the interposer 400 to the substrate 301 can be prevented from being transferred to the substrate 301 more reliably.

The first adhesive layer 303_1 can be disposed on a periphery of the side surface of the protrusion 302 to enhance the fixability of the protrusion 302. When the protrusion 302 is formed separately from the substrate 301, the protrusion 302 can be separated from the substrate 301 because the size of the protrusion 302 is very small. Accordingly, since the first adhesive layer 303_1 is disposed on the periphery of the side surface of the protrusion 302, it is possible to prevent the protrusion 302 from being separated from the substrate 301. In particular, when the second adhesive layer 303_2 is disposed on the protrusion 302, the fixing property of the protrusion 302 can be further strengthened.

Meanwhile, the plurality of semiconductor light emitting devices 310, 320, 330 can be disposed on the adhesive layer 303. For example, the plurality of semiconductor light emitting devices 310, 320, 330 can be fixed to the substrate 301 by an adhesive layer 303. As shown in FIG. 4, the plurality of semiconductor light emitting devices 310, 320, 330 can be electrically connected to the driving transistor DT.

Each of the semiconductor light emitting devices 310, 320, 330 can include a group II-IV compound or a group III-V compound, but is not limited thereto. For example, group III-V compounds can be selected from the group consisting of a diatomic compound selected from the group consisting of GaN, GaP, GaAs, GaSb, AlN, AlP, AlAs, AlSb, InN, InP, InAs, InSb and mixtures thereof, ternary compounds selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof, and quaternary compounds selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

Each of the plurality of semiconductor light emitting devices 310, 320, 330 can be a Micro-LED having a micro-scale size or a Nano-LED having a nano-scale size, but is not limited thereto. Each of the plurality of semiconductor light emitting devices 310, 320, 330 can have a cylindrical shape, a square shape, an oval shape, or a plate shape, but is not limited thereto.

The plurality of semiconductor light emitting devices 310, 320, 330 can be disposed in each of the plurality of pixels PX. For example, the plurality of semiconductor light emitting devices can include the first semiconductor light emitting device 310, the second semiconductor light emitting device 320, and the third semiconductor light emitting device 330, but is not limited thereto. For example, the first semiconductor light emitting device 310 can include a red semiconductor light emitting device, the second semiconductor light emitting device 320 can include a green semiconductor light emitting device, and the third semiconductor light emitting device 330 can include a blue semiconductor light emitting device.

Meanwhile, each of the pixels PX1 to PX4 can include a first area 3010, a second area 3020, a third area 3030, and a fourth area 3040 as shown in FIG. 13.

For example, the first semiconductor light emitting device 310 can be disposed in the first region 3010, the second semiconductor light emitting device 320 can be disposed in the second region 3020, and the third semiconductor light emitting device 330 can be disposed in the third region 3030. The arrangement order of the first semiconductor light emitting device 310, the second semiconductor light emitting device 320, and the third semiconductor light emitting device 330 can also be changed.

For example, the first region 3010, the second region 3020, and the third region 3030 can be positioned in a line along one direction, but the present invention is not limited thereto. For example, although the first area 3010, the second area 3020, and the third area 3030 are located in a center area of each of the pixels PX1 to PX4, the present disclosure is not limited thereto.

For example, the fourth area 3040 can be a remaining area except for the first area 3010, the second area 3020, and the third area 3030.

A plurality of protrusions 302 can be disposed in the fourth region 3040.

As shown in FIG. 14, twelve semiconductor light emitting devices 310_1 to 310_4, 320_1 to 320_4, and 330_1 to 330_4 can be provided in the interposer 400. Among them, four red semiconductor light emitting devices 310_1, 310_2, 310_3, and 310_4 can be arranged in a vertical direction adjacent to each other, four green semiconductor light emitting devices 320_1, 320_2, 320_3, 320_4 can be arranged in a vertical direction adjacent to each other and four blue semiconductor light emitting devices 330_1, 330_2, 330_3, and 330_4 can be arranged adjacent to each other in the vertical direction.

Therefore, in the interposer 400, one red semiconductor light emitting device 310_1, one green semiconductor light emitting device 320_1, and one blue semiconductor light emitting device 330_1 can be respectively transferred to the first pixel PX1 of the substrate 301, the remaining red semiconductor light emitting devices 310_2 to 310_4, green semiconductor light emitting devices 320_2 to 320_4, and blue semiconductor light emitting devices 330_2 to 330_4 can also be sequentially transferred to the second pixel PX2, the third pixel P3, and the fourth pixel PX4 of the one-piece substrate 301.

When the interposer 400 is positioned on the first pixel PX1 to transfer to the first pixel PX1, each of the red semiconductor light emitting device 310_1, the green semiconductor light emitting device 320_1, and the blue semiconductor light emitting device 330_3 can be positioned to correspond to the first area 3010, the second area 3020, and the third area 3030 of the first pixel PX1, the remaining red semiconductor light emitting devices 310_2 to 310_4, green semiconductor light emitting devices 320_2 to 320_4, and blue semiconductor light emitting devices 330_2 to 330_4 that are not to be transferred to the first pixel PX1 can also be positioned to correspond to the plurality of protrusions 302 of the first pixel PX1.

When the interposer 400 or the substrate 301 is pressed, the red semiconductor light emitting device 310_1, the green semiconductor light emitting device 320_1 and the blue semiconductor light emitting device 330_3 to be transferred from the interposer 400 to the first pixel PX1 can be transferred to the first region 3010, the second region 3020, and the third region 3030 of the first pixel PX1, respectively.

The remaining semiconductor light emitting devices 320_2 to 320_4, 330_2 to 330_4 on the interposer 400 may not be transferred to the first pixel PX1 due to the plurality of protrusions 302 and the adhesive layer 303 on the protrusions 302.

For example, since the second adhesive layer 303_2 on the protrusion 302 is thin, the remaining semiconductor light emitting devices 320_2 to 320_4, 330_2 to 330_4 are not transferred to the first pixel PX1, so a transfer failure can be fundamentally blocked.

Similarly, when the interposer 400 moves to each of the second pixel PX2, the third pixel PX3, and the fourth pixel PX4 to perform a transfer process, only the semiconductor light emitting devices to be transferred to the corresponding pixel PX2 to PX4 can be transferred.

For example, the plurality of protrusions 302 can be arranged in a matrix within the pixel PX or in the fourth area 3040. For example, the plurality of protrusions 302 can be disposed at regular intervals in the pixel PX or in the fourth area 3040. For example, the distance between the adjacent protrusions 302 in the pixel PX or in the fourth area 3040 can be the same.

The semiconductor light emitting device to be transferred to the substrate 301 as well as the semiconductor light emitting device not to be transferred to the substrate 301 can be disposed on the interposer 400 while maintaining the same distance from each other. In this case, since the plurality of protrusions 302 disposed in the first region 3010, the second region 3020, and the third region 3030 as well as the fourth region 3040 of the pixel PX are also disposed to correspond to each of the plurality of semiconductor light emitting devices provided on the interposer 400, the plurality of protrusions 302 disposed in the first region 3010, the second region 3020, and the third region 3030 as well as the fourth region 3040 can have the same distance from each other.

For example, as shown in FIG. 13, the distance L11 between the red semiconductor light emitting device 310_1 and the adjacent protrusion 302 can be the same as the distance L12 between the green semiconductor light emitting device 310_2 and the adjacent protrusion 302. Similarly, the distance between the adjacent protrusions 302 can also be the same as the distance between the red semiconductor light emitting device 310_1 and the adjacent protrusion 302 or between the green semiconductor light emitting device 310_2 and the adjacent protrusions 302.

For example, as shown in FIG. 14, the distances L21 and L22 between the adjacent semiconductor light emitting devices 310_1, 310_2, 320_1, 320_2, etc. of the interposer 400 can be the same as the distance L12 between the semiconductor light emitting devices 310_1 and 310_2 shown in FIG. 13 and the protrusion 302 or the distance between the adjacent protrusions 302

For example, the plurality of protrusions 302 can have the same shape, but the present invention is not limited thereto.

On the other hand, although the projection 302 has a rectangular shape in the drawings, it can have various other shapes.

As a first example, as shown in FIG. 33, the protrusion 302 can have a shape corresponding to a shape of a preset region 3200 corresponding to a size of the semiconductor light emitting device (310, 320, 330 of FIG. 11). For example, when the semiconductor light emitting devices 310, 320, 330 have a rectangular shape, the protrusion 302 can also have a rectangular shape.

The preset region 3200 can be a region corresponding to the size of the semiconductor light emitting devices 310, 320, 330. The preset region 3200 can be a region corresponding to a semiconductor light emitting device not to be transferred from the interposer 400 to the substrate 301 when the interposer 400 is pressed against the substrate 301. The preset region 3200 can be a region formed in the adhesive layer 303 disposed on the protrusion 302. For example, in the preset region 3200, when the interposer 400 is pressed against the substrate 301, since a semiconductor light emitting device that are not to be transferred to the substrate 301 is in contact with the preset region 3200, and this semiconductor light emitting device is not transferred to the substrate 301 because the semiconductor light emitting device is not adhered to the adhesive layer 303 on the protrusion 302 by the protrusion 302 and the adhesive layer 303 on the protrusion 302, the transfer failure can be prevented.

The size of the protrusion 302 can be larger than the preset area 3200. The size of the protrusion 302 can be the same as or smaller than the preset area 3200.

As a second example, as shown in FIG. 34, the protrusion 302 can have a shape corresponding to a shape of a preset region 3200 corresponding to a size of the semiconductor light emitting device (310, 320, 330 of FIG. 11). For example, when the semiconductor light emitting devices 310, 320, 330 have a circular shape, the protrusion 302 can also have a circular shape.

The size of the protrusion 302 can be larger than the preset area 3200. The size of the protrusion 302 can be the same as or smaller than the preset area 3200.

Meanwhile, the protrusion 302 can include a plurality of protrusions, which will be described in the following third to fifth examples.

As a third example, as shown in FIG. 35, the plurality of bumps 3301, 3302, and 3303 can be disposed across a preset region 3200 corresponding to the size of the semiconductor light emitting device (310, 320, 330 of FIG. 11). In this case, the adhesive layer 303 can be disposed between the plurality of bumps 3301, 3302, and 3303 and on the top surface of each of the plurality of bumps 3301, 3302, 3303.

For example, the upper surface of the adhesive layer 303 disposed between the plurality of bumps 3301, 3302, and 3303 can be positioned lower than the upper surface of the adhesive layer 303 disposed on the upper surface of each of the plurality of bumps 3301, 3302, 3303. To this end, the thickness of each of the plurality of bumps 3301, 3302, 3303 can be equal to or greater than the thickness of the adhesive layer 303 disposed around the plurality of bumps 3301, 3302, 3303.

For example, when the semiconductor light emitting device (310, 320, 330 in FIG. 11) is pressed to the preset region 3200, the semiconductor light emitting devices 310, 320, 330 are in contact with the top surface of the adhesive layer 303 disposed on the top surface of each of the plurality of bumps 3301, 3302, 3303, but the upper surface of the adhesive layer 303 disposed between the plurality of bumps 3301, 3302, and 3303 may not be in contact. Accordingly, by minimizing the area of the preset region 3200 in contact with the semiconductor light emitting device 310, 320 and 330 by means of a plurality of bumps 3301, 3302, 3303, and by preventing the semiconductor light emitting device that are not to be transferred to the substrate 301 from being transferred to the substrate 301, it is possible to fundamentally block transfer defects.

As a fourth example, as shown in FIG. 36, the plurality of bumps 3311, 3312, 3313 can be disposed at corners 3210 of the preset region 3200 corresponding to the sizes of the plurality of semiconductor light emitting devices (310, 320, 330 of FIG. 11).

As a fifth example, as shown in FIG. 37, the plurality of bumps 3321, 3322, 3323 can be disposed on the sides 3220 of the preset region 3200 corresponding to the sizes of the plurality of semiconductor light emitting devices (310, 320, 330 of FIG. 11).

As shown in FIGS. 36 and 37, a plurality of bumps 3311, 3312, 3313, 3321, 3322, 3323 are provided, and the thickness of the plurality of bumps 3311, 3312, 3313, 3321, 3322, 3323 can be equal to or greater than the thickness of the adhesive layer 303 disposed around each of the plurality of bumps 3311, 3312, 3313, 3321, 3322, 3323. In this case, when the semiconductor light emitting device that are not to be transferred from the interposer 400 to the substrate 301 is pressed into the preset region 3200 during the transfer process, the semiconductor light emitting device can contact only the adhesive layer 303 on the plurality of bumps 3311, 3312, 3313, 3321, 3322, 3323, and may not contact the adhesive layer 303 disposed around each of the plurality of bumps 3311, 3312, 3313, 3321, 3322, 3323. Therefore, by minimizing the area of the preset region 3200 in contact with the semiconductor light emitting device 310, 320, 330 by the plurality of bumps 3311, 3312, 3313, 3321, 3322, 3323, and by preventing the semiconductor light emitting device that are not to be transferred to the substrate 301 from being transferred to the substrate 301, it is possible to fundamentally block transfer defects.

In addition, since the plurality of bumps 3311, 3312, 3313, 3321, 3322, 3323 are disposed on the corner 3210 or the side 3220 of the preset area 3200, while minimizing the contact area of the semiconductor light emitting device that are not to be transferred from the interposer 400 to the substrate 301, it is possible to prevent the semiconductor light emitting device from being transferred unintentionally due to non-uniform contact by making the semiconductor light emitting device uniformly contact the preset region 3200. For example, when the plurality of bumps 3311, 3312, 3313, 3321, 3322, 3323 are not arranged symmetrically with each other, the semiconductor light emitting device that are not to be transferred from the interposer 400 to the substrate 301 is not uniformly in contact with the preset region 3200, so the semiconductor light emitting device can be twisted by the force pressed against the interposer 400 or the substrate 301, can be separated from the interposer 400, and can be transferred to a preset region 3200, which can cause transfer failure.

Meanwhile, as a sixth example, as shown in FIG. 38, the protrusion 302 can include a plurality of dot patterns 3350.

The plurality of dot patterns 3350 can have a shape corresponding to the shape of the preset region 3200 corresponding to the size of the semiconductor light emitting device (310, 320, 330 of FIG. 11). For example, the total size of the plurality of dot patterns 3350 can be equal to or larger than the preset area 3200.

In the drawing, the dot pattern 3350 has a circular shape, but various shapes are possible.

As described above with the plurality of dot patterns 3350 shown in FIG. 38, the contact area of the semiconductor light emitting device that are not to be transferred from the interposer 400 to the substrate 301 is minimized, it is possible to prevent the semiconductor light emitting device from being unintentionally transferred due to non-uniform contact by making the semiconductor light emitting device uniformly contact the preset region 3200.

On the other hand, according to the embodiment, it is possible to continuously transfer a plurality of times using the single interposer 400.

Conventionally, a plurality of interposers are required to transfer to a plurality of partitioned areas on the display substrate 301. For example, the semiconductor light emitting devices ware transferred to each of the plurality of partitioned regions of the display substrate 301 using each of the plurality of interposers. Since the plurality of interposers are sequentially moved to the corresponding division area of the display substrate to perform the transfer process, there is a problem in that the process time is significantly increased.

On the other hand, in the embodiment, the transferring of the semiconductor light emitting devices 310, 320, 330 can be performed using one or two interposers 400 in a plurality of partitioned regions (300_1 to 300_16 of FIG. 22B) of the display substrate 301. For example, by after one interposer 400 is moved to the display substrate 301, a transfer process is performed to sequentially move to each partitioned area 300_1 to 300_16, so there is an advantage in that the process time is significantly reduced and mass production is possible.

[Method of Transferring to the Substrate 301 Using the Interposer According to the First Embodiment]

FIG. 15 is a plan view showing an interposer according to the first embodiment. FIG. 16 is a cross-sectional view taken along line A-B of FIG. 14.

As shown in FIGS. 15 and 16, the interposer 400 according to the first embodiment can include a substrate 401, a plurality of protrusions 402, and a plurality of semiconductor light emitting devices 310_1, 310_2, 320_1, 320_2, 330_1 and 330_2.

The plurality of protrusions 402 can be disposed on the substrate 401. The plurality of protrusions 402 can be integrally formed with the substrate 401, but the present invention is not limited thereto.

The plurality of protrusions 402 can correspond to the pixels PX of the display device 300 to be transferred. The plurality of protrusions 402 can be omitted.

Although twenty-four semiconductor light emitting devices are provided in the interposer 400 to correspond to the pixels PX of the display device 300 in the drawing, the present invention is not limited thereto. For example, eight each of the red semiconductor light emitting devices, the green semiconductor light emitting devices, and the blue semiconductor light emitting devices can be provided. For example, the eight red semiconductor light emitting devices can be arranged adjacent to two each other in the vertical direction, eight green semiconductor light emitting devices can be arranged adjacent to two each other in the vertical direction, and eight blue semiconductor light emitting devices can be arranged adjacent to two each other in the vertical direction.

On the other hand, when only the adhesive layer 303 is provided on the substrate 301, during the transfer process, there is a problem in that semiconductor light emitting devices that are not to be transferred to the substrate 301 are transferred to the substrate 301, causing a transfer defect.

For example, as shown in FIG. 17(*a*), the interposer 400 is positioned on the substrate 301 of the display device 300, and ultraviolet (UV) light is irradiated from the rear surface of the substrate 301 so that a specific area of the adhesive layer 303 is not harden and the remaining area is hardened.

Thereafter, as the interposer 400 or the substrate 301 is pressed, the semiconductor light emitting device 311*a* of the interposer 400 is transferred to a specific region of the substrate 301. However, if the adhesive layer 303 is not completely cured due to the curing failure of the adhesive layer 303 by UV irradiation, the semiconductor light emitting device 311*b* which is not to be transferred from the interposer 400 to the substrate 301 might be transferred to the remaining region of the substrate 301, causing transfer failure.

In FIG. 17, reference numeral 303*a* denotes a non-cured area, and reference numeral 303*b* denotes a cured area.

In the embodiment, in order to solve this problem, a plurality of protrusions 302 can be disposed on the substrate 301 as described above. The prevention of transfer failure by the protrusion 302 and the adhesive layer 303 disposed thereon has already been described in detail above, so a further description will be omitted.

FIG. 18 shows a state in which the light emitting device on the interposer of FIG. 15 is transferred to the first partition area of the substrate of FIG. 22. FIG. 19 shows a state in which the light emitting device on the interposer of FIG. 15 is transferred to the second partition area of the substrate of FIG. 22.

As shown in FIGS. 15, 16, and 18, after the interposer 400 is positioned on the first partition area (300_1 in FIG. 22) of the substrate 301 of the display device 300, through the alignment process, the plurality of semiconductor light emitting devices 310_1, 320_1, and 330_1 of the interposer 400 can correspond to the plurality of regions of the first partitioned region 300_1 of the substrate 301. Then, by pressing the interposer 400 or the display device 300, each of the plurality of semiconductor light emitting devices 310_1, 320_1, and 330_1 of the interposer 400 can be transferred to a plurality of regions of the first partitioned region 300_1 of the substrate 301.

Meanwhile, when alignment is performed between the interposer 400 and the substrate 301, each of the semiconductor light emitting devices 310_2, 320_2, and 330_2 that are not to be transferred from the interposer 400 to the plurality of regions of the first partition region 300_1 of the substrate 301 can be positioned to correspond to the plurality of protrusions 302. Therefore, even if the interposer 400 or the display device 300 is pressed, since the semiconductor light emitting devices 310_2, 320_2, and 330_2 are not transferred to the substrate 301 by the plurality of protrusions 302 and the adhesive layer 303 disposed on the protrusions 302, transfer failure can be prevented.

As shown in FIGS. 15, 16 and 19, after the interposer 400 on which the transfer of the first partitioned area 300_1 of the substrate 301 has been performed is moved to the second partitioned area 300_2 of the substrate 301 adjacent to the first partitioned area 300_1 of the substrate 301, an alignment process can be performed.

Through the alignment process, the plurality of semiconductor light emitting devices 310_2, 320_2, and 330_2 of the interposer 400 can correspond to the plurality of regions of the second partitioned region 300_2 of the substrate 301. Then, by pressing the interposer 400 or the display device 300, each of the plurality of semiconductor light emitting devices 310_2, 320_2, and 330_2 of the interposer 400 can be transferred to a plurality of regions of the second partitioned region 300_2 of the substrate 301. In the drawing, the corresponding region of the interposer 400 corresponding to the protrusion 302 disposed in the second partitioned region 300_2 of the substrate 301 has already been transferred to the first partitioned region 300_1 of the substrate 301 so that no semiconductor light emitting device is present.

In addition to the semiconductor light emitting devices 310_1, 320_1, and 330_1 transferred to the first partitioned region 300_1 of the substrate 301, when a semiconductor light emitting device corresponding to the plurality of protrusions 302 of the second partition region 300_2 of the substrate 301 is provided in the interposer 400, the semiconductor light emitting device 310_2, 320_2, 330_2 need not be transferred to the substrate 301 by the plurality of protrusions 302 and the adhesive layer 303 disposed on the protrusions 302, thereby preventing transfer failure.

FIG. 20 shows a state in which two light emitting devices are disposed in each sub-pixel of an interposer.

As shown in FIG. 20, two light emitting devices can be arranged in each sub-pixel of the interposer.

For example, when the pitch between sub-pixel regions is X and the length (or width) of the semiconductor light emitting device is Y, the masking distance Z can be expressed by Equation 1. The sub-pixel region can mean a region occupied by each semiconductor light emitting device.

$$Y<Z<X-Y/2 \quad \text{Equation 1:}$$

The masking distance Z can mean a distance between semiconductor light emitting devices provided in one unit pixel PX in the interposer 400.

From Equation 1, when the masking distance Z is smaller than the length Y of the semiconductor light emitting device, the semiconductor light emitting device can overlap each other and can be misplaced. When the masking distance Z is greater than X−Y/2, the semiconductor light emitting device can be disposed in an adjacent sub-pixel area, resulting in poor arrangement.

For example, when the pitch X between sub-pixel regions is fixed, as the length Y of the semiconductor light emitting device decreases, more semiconductor light emitting devices can be disposed in the sub-pixel region. For example, when the length Y of the semiconductor light emitting device is fixed, as the pitch X between sub-pixel areas increases, more semiconductor light emitting devices can be disposed in the sub-pixel area.

FIG. 21 shows a state in which three light emitting devices are disposed in each sub-pixel of an interposer.

As shown in FIG. 21, three light emitting devices can be arranged in each sub-pixel of the interposer 400.

Similarly, according to Equation 1, the masking distance Z can vary according to the pitch X between sub-pixel regions and the length Y of the semiconductor light emitting device.

Unlike FIGS. 20 and 21, four or more semiconductor light emitting devices can be arranged in each sub-pixel of the interposer 400.

As described above, first to third regions (3010, 3020, and 3030 of FIG. 13) and a fourth region 3040 having a plurality of protrusions 302 in the pixel PX of the display device can be provided in divided regions 300_1 to 300_16 of the substrate 301 or in the pixel PX of the display device to correspond to a plurality of semiconductor light emitting devices arranged in each sub-pixel of the interposer 400.

Therefore, during the transfer process, the first to third semiconductor light emitting devices 310, 320, 330 of the interposer 400 can be transferred to the first to third regions (3010, 3020, 3030 in FIG. 13) of each pixel PX of the substrate 301, the remaining semiconductor light emitting devices of the interposer 400 may not be transferred to each pixel PX of the substrate 301 by the plurality of protrusions 302 provided in each pixel PX and the adhesive layer 303 disposed thereon.

FIG. 22 shows a state in which one interposer is used to continuously transfer eight times.

As shown in FIGS. 15, 16 and 22, a plurality of semiconductor light emitting devices can be transferred to the plurality of partitioned regions 300_1 to 300_4 and 300_9 to 300_12 partitioned on the substrate 301 of the display device 300 using one interposer 400.

For example, a plurality of semiconductor light emitting devices can be transferred by moving the interposer 400 to the first partitioned area 300_1 of the substrate 301, and the interposer 400 can be moved to the adjacent second partitioned area 300_2.

The plurality of semiconductor light emitting devices of the interposer 400 can be transferred to the second partitioned area 300_2 and then moved to the adjacent third partitioned area 300_3.

In this way, a plurality of semiconductor light emitting devices on the interposer 400 can be sequentially moved from the first partitioned area 300_1 to an adjacent partitioned area 300_2 to 300_4 and 300_9 to 300_12 to be transferred to the corresponding partitioned areas 300_2 to 300_4 and 300_9 to 300_12.

Conventionally, since the interposer is provided as much as each partitioned area of the substrate 301, the interposer is individually moved to the corresponding partitioned area to perform the transfer process, so the process time is significantly increased.

In contrast, in the embodiment, since the single interposer 400 enables the transfer of the semiconductor light emitting device to all of the partition regions 300_1 to 300_4 and 300_9 to 300_12 of the substrate 301, the process time can be significantly reduced.

In addition, in the embodiment, a plurality of protrusions 302 are disposed on the substrate 301, so semiconductor light emitting devices that are not to be transferred from the interposer 400 to the substrate 301 by the protrusions 302 need not be transferred to the substrate 301, and it is possible to fundamentally block transfer defects.

Method of Transferring to the Substrate 301 Using the Interposer According to the Second Embodiment FIG. 23 is a plan view showing an interposer according to the second embodiment.

As shown in FIG. 23, the interposer 400A according to the second embodiment can include a substrate 401, a plurality of protrusions 402, and a plurality of semiconductor light emitting devices 310_1 to 310_3, 320_1 to 320_3, and 330_1 to 330_3.

Since the substrate 401 and the protrusion 402 are the same as the substrate 401 and the protrusion 402 shown in FIG. 16, it can be easily understood from FIG. 16.

In the drawing, twenty-seven semiconductor light emitting devices are provided in the interposer 400A corresponding to the pixels PX of the display device 300, but the present invention is not limited thereto.

The first to third semiconductor light emitting devices 310_1 to 310_3, 320_1 to 320_3, and 330_1 to 330_3 can be adjacent to each other and arranged in one set 405, 406, 407. For example, the first set 405 configured so that the first to third semiconductor light emitting devices 310_1, 320_1, and 330_1 are adjacent to each other can be arranged in a vertical direction. For example, the second set 406 configured to be adjacent to the first set 405 so that the first to third semiconductor light emitting devices 310_2, 320_2, and 330_2 are adjacent to each other can be arranged in a vertical direction. For example, the third set 407 configured to be adjacent to the second set 406 so that the first to third semiconductor light emitting devices 310_3, 320_3, and 330_3 are adjacent to each other can be arranged in a vertical direction.

Each of the first to third sets 405, 406, 407 can be disposed on the protrusion 402, but this is not limited thereto.

FIG. 24 shows a state in which the light emitting element of the interposer of FIG. 23 is transferred to the first partitioned area of FIG. 28. FIG. 25 shows a state in which the light emitting device of the interposer of FIG. 23 is transferred to the second partition area of FIG. 28. FIG. 26 shows a state in which the light emitting device of the interposer of FIG. 23 is transferred to the third partitioned area of FIG. 28.

As shown in FIGS. 23 and 24, after the interposer 400A is positioned on the first partition area (300_1 in FIG. 28) of the substrate 301 of the display device 300, through the alignment process, the plurality of semiconductor light emitting devices 310_1, 320_1, and 330_1 of the interposer 400A can correspond to the plurality of regions of the first partitioned region 300_1 of the substrate 301. Thereafter, by pressing the interposer 400A or the display device 300, each of the plurality of semiconductor light emitting devices 310_1, 320_1, and 330_1 of the interposer 400A can be transferred to a plurality of regions of the first partitioned region 300_1 of the substrate 301.

On the other hand, when alignment is performed between the interposer 400A and the substrate 301, each of the semiconductor light emitting devices 310_2, 320_2, 330_2, 310_3, 320_3 and 330_3 that are not to be transferred from the interposer 400A to the plurality of regions of the first partitioned region 300_1 of the substrate 301 might be positioned to correspond to the plurality of protrusions 302.

Therefore, even if the interposer 400A or the display device 300 is pressed, since the semiconductor light emitting device 310_2, 320_2, 330_2, 310_3, 320_3 and 330_3 need not be transferred to the substrate 301 by the plurality of protrusions 302 and the adhesive layer 303 disposed on the protrusions 302, transfer failure can be prevented.

As shown in FIGS. 23 and 25, after the interposer 400A on which the transfer of the first partitioned area 300_1 of the substrate 301 is moved to the second partitioned area 300_2 of the substrate 301 adjacent to the first partitioned area 300_1 of the substrate 301, an alignment process can be performed.

Through the alignment process, the plurality of semiconductor light emitting devices 310_2, 320_2, and 330_2 of the interposer 400A can correspond to the plurality of regions of the second partitioned region 300_2 of the substrate 301. Thereafter, as the interposer 400A or the display device 300 is pressed, each of the plurality of semiconductor light emitting devices 310_2, 320_2, and 330_2 of the interposer 400A can be transferred to a plurality of regions of the second partitioned region 300_2 of the substrate 301.

On the other hand, when alignment is performed between the interposer 400A and the substrate 301, each of the semiconductor light emitting devices 310_3, 320_3, and 330_3 that are not to be transferred from the interposer 400A to the plurality of regions of the second partition region 300_2 of the substrate 301 might be positioned to correspond to the plurality of protrusions 302. Therefore, even if the interposer 400A or the display device 300 is pressed, since the semiconductor light emitting devices 310_3, 320_3, and 330_3 need not be transferred to the substrate 301 by the plurality of protrusions 302 and the adhesive layer 303 disposed on the protrusions 302, transfer failure can be prevented.

As shown in FIGS. 23 and 26, after the interposer 400A on which the transfer of the second partition region 300_2 of the substrate 301 is moved to the third partitioned area 300_3 of the substrate 301 adjacent to the second partitioned area 300_2 of the substrate 301, an alignment process can be performed.

Through the alignment process, the plurality of semiconductor light emitting devices 310_3, 320_3, and 330_3 of the interposer 400A can correspond to a plurality of regions of the third partitioned region 300_3 of the substrate 301. Thereafter, as the interposer 400A or the display device 300 is pressed, each of the plurality of semiconductor light emitting devices 310_3, 320_3, and 330_3 of the interposer 400A can be transferred to a plurality of regions of the second partitioned region 300_2 of the substrate 301.

FIG. 27 shows a state in which three light emitting devices are disposed in a sub-pixel of an interposer.

As shown in FIG. 27, three light emitting devices can be arranged in each sub-pixel of the interposer 400A.

According to Equation 1, the masking distance Z can vary according to the pitch X between sub-pixel regions and the length Y of the semiconductor light emitting device.

Unlike FIG. 27, four or more semiconductor light emitting devices can be arranged in each sub-pixel of the interposer 400A.

As described above, the first to third regions (3010, 3020, and 3030 of FIG. 13) and a fourth region 3040 having a plurality of protrusions 302 can be provided in divided regions 300_1 to 300_9 of FIG. 28B of the substrate 301 or in the pixel PX of the display device to correspond to a plurality of semiconductor light emitting devices arranged in each sub-pixel of the interposer 400A.

Therefore, during the transfer process, the first to third semiconductor light emitting devices 310_1, 320_1, and 330_1 of FIG. 23 of the interposer 400A can be transferred to the first to third regions (3010, 3020, 3030 in FIG. 13) of each pixel PX of the substrate 301, the remaining semiconductor light emitting devices 310_2, 320_2, 330_2, 310_3, 320_3, and 330_3 of the interposer 400A need not be transferred to each pixel PX of the substrate 301 by the plurality of protrusions 302 provided in each pixel PX and the adhesive layer 303 disposed thereon.

FIG. 28 shows a state of consecutively transferring nine times using one interposer.

As shown in FIGS. 23 and 28, a plurality of semiconductor light emitting devices can be transferred to the plurality of partitioned areas 300_1 to 300_9 partitioned on the substrate 301 of the display device 300 using one interposer 400A.

For example, a plurality of semiconductor light emitting devices can be transferred by moving the interposer 400A to the first partitioned area 300_1 of the substrate 301, and the interposer 400A can be moved to the adjacent second partitioned area 300_2.

After the plurality of semiconductor light emitting devices of the interposer 400A are transferred to the second partitioned area 300_2, the interposer 400A can be moved to the adjacent third partitioned area 300_3. In this way, the plurality of semiconductor light emitting devices on the interposer 400A can be sequentially moved from the first partitioned area 300_1 to the adjacent partitioned areas 300_2 to 300_9 to be transferred to the corresponding partitioned areas 300_2 to 300_9.

Conventionally, since the interposer 400A is provided as much as each partitioned area of the substrate, and the interposer 400A is individually moved to the corresponding partitioned area to perform the transfer process, the process time is significantly increased.

In contrast, in the embodiment, since the single interposer 400A enables the transfer of the semiconductor light emitting device to all of the partition regions 300_1 to 300_9 of the substrate 301, the process time can be significantly reduced.

In addition, in the embodiment, a plurality of protrusions 302 are disposed on the substrate, so semiconductor light emitting devices that are not to be transferred from the interposer 400A to the substrate by the protrusions 302 need not be transferred to the substrate 301, it is possible to fundamentally block transfer defects.

Second Embodiment

FIG. 29 is a cross-sectional view illustrating a display device according to a second embodiment.

The second embodiment is similar to the first embodiment except that the plurality of semiconductor light emitting devices 310, 320, 330 are disposed in the plurality of grooves 3110, 3120, and 3130 of the adhesive layer 303. In the second embodiment, the same reference signs are assigned to components having the same structure, shape and/or function as those of the first embodiment, and detailed descriptions are omitted. Components omitted in the following description can be easily understood from the description of the first embodiment as described above.

Referring to FIG. 29, the display device 300A according to the second embodiment can include a substrate 301, a plurality of protrusions 302, an adhesive layer 303, and a plurality of semiconductor light emitting devices 310, 320, 330.

Since each of the substrate 301, the plurality of protrusions 302, the adhesive layer 303, and the plurality of semiconductor light emitting devices 310, 320, 330 has already been described in detail above, hereinafter, different features will be mainly described.

The adhesive layer 303 can be disposed on the substrate 301. The adhesive layer 303 can be disposed on the substrate 301 and the plurality of protrusions 302.

The adhesive layer 303 can include a plurality of grooves 3110, 3120, 3130. he plurality of grooves can include a first groove 3110, a second groove 3120, and a third groove 3130. For example, the first semiconductor light emitting device 310 can be disposed in the first groove 3110, and the second semiconductor light emitting device 320 can be disposed in the second recess 3120, and the third semiconductor light emitting device 330 can be disposed in the third groove 3130.

For example, the first groove 3110 can have a shape corresponding to the shape of the first semiconductor light emitting device 310. For example, the first groove 3110 can have a size equal to or larger than that of the first semiconductor light emitting device 310. For example, the first semiconductor light emitting device 310 can be fixedly inserted into the first groove 3110. For example, a lower surface of the first semiconductor light emitting device 310 can be in contact with a bottom surface of the first groove 3110, and a portion of a side surface of the first semiconductor light emitting device 310 can be in contact with an inner surface of the first groove 3110.

For example, the first semiconductor light emitting device 310 can include a first conductivity type semiconductor layer, an active layer on the first conductivity type semiconductor layer, and a second conductivity type semiconductor layer on the active layer, and a portion of the first conductivity type semiconductor layer can be inserted into the first groove 3110.

Since the first semiconductor light emitting device 310 is inserted and fixed into the first groove 3110 of the adhesive layer 303, the fixability of the first semiconductor light emitting device 310 can be further strengthened.

For example, the second groove 3120 can have a shape corresponding to the shape of the second semiconductor light emitting device 320. For example, the second groove 3120 can have a size equal to or larger than that of the second semiconductor light emitting device 320. For example, the second semiconductor light emitting device 320 can be inserted into and fixed to the second groove 3120.

For example, the lower surface of the second semiconductor light emitting device 320 can be in contact with the bottom surface of the second groove 3120, and a portion of the side surface of the second semiconductor light emitting device 320 can be in contact with the inner surface of the second groove 3120. For example, the second semiconductor light emitting device 320 can include a first conductivity type semiconductor layer, an active layer on the first conductivity type semiconductor layer, and a second conductivity type semiconductor layer on the active layer, and a portion of the first conductivity type semiconductor layer can be inserted into the second groove 3120.

Since the second semiconductor light emitting device 320 is inserted into the second groove 3120 of the adhesive layer 303 and fixed, the fixability of the second semiconductor light emitting device 320 can be further strengthened.

For example, the third groove 3130 can have a shape corresponding to the shape of the third semiconductor light emitting device 330. For example, the third groove 3130 can have a size equal to or larger than that of the third semiconductor light emitting device 330. For example, the third semiconductor light emitting device 330 can be inserted into and fixed to the third groove 3130.

For example, a lower surface of the third semiconductor light emitting device 330 can be in contact with a bottom surface of the third groove 3130, and a portion of a side surface of the third semiconductor light emitting device 330 can be in contact with an inner surface of the third groove 3130. For example, in the third semiconductor light emitting device 330 including a first conductivity type semiconductor layer, an active layer on the first conductivity type semiconductor layer, and a second conductivity type semiconductor layer on the active layer, a portion of the first conductivity type semiconductor layer can be inserted into the third groove 3130.

Since the third semiconductor light emitting device 330 is inserted and fixed into the third groove 3130 of the adhesive layer 303, the fixability of the third semiconductor light emitting device 330 can be further enhanced.

Third Embodiment

FIG. 30 is a cross-sectional view showing a display device according to a third embodiment.

The third embodiment is similar to the first or second embodiment except for changing the thickness of the protrusion and the material of the protrusion 302. In the third embodiment, the same reference signs are assigned to components having the same structure, shape and/or function as those of the first or second embodiment, and detailed descriptions are omitted. Components omitted in the following description can be easily understood from the description of the first or second embodiment as described above.

Referring to FIG. 30, the display device 300B according to the third embodiment can include a plurality of protrusions 302, an adhesive layer 303, and a plurality of semiconductor light emitting devices 310, 320, 330.

Since each of the substrate 301, the plurality of protrusions 302, the adhesive layer 303 and the plurality of semiconductor light emitting devices 310, 320, 330 has already been described in detail above, hereinafter, different technologies will be mainly described.

The adhesive layer 303 can include a first adhesive layer 303_1 disposed on the substrate 301 and a second adhesive layer 303_2 disposed on the protrusion 302.

For example, the thickness T of the protrusion 302 can be greater than the thickness T11 of the first adhesive layer 303_1. For example, the upper surface of the protrusion 302 can be positioned higher than the upper surface of the first adhesive layer 303_1. In this case, when the semiconductor light emitting devices 310, 320, 330 are disposed on the first adhesive layer 303_1, each of the semiconductor light emitting devices 310, 320, 330 can horizontally overlap a portion of the protrusion 302. For example, a lower portion of each of the semiconductor light emitting devices 310, 320, 330 can horizontally overlap an upper portion of the protrusion 302.

Accordingly, the light emitted laterally from each of the semiconductor light emitting devices 310, 320, 330 can be reflected forward by the protrusion 302, so the luminance can be improved due to an increase in the amount of light. To this end, the protrusion 302 can be made of a reflective material having excellent reflective properties. In particular, when the protrusion 302 is made of a reflective material, the luminance can be further improved by further increasing the light reflectivity.

Fourth Embodiment

FIG. 31 is a cross-sectional view illustrating a display device according to a fourth embodiment.

The fourth embodiment is similar to the first embodiment, the second embodiment, or the third embodiment except for the reflector 340.

In the fourth embodiment, the same reference signs are assigned to components having the same structure, shape and/or function as those of the first, second, or third embodiment, and detailed descriptions can be omitted. Components omitted in the following description can be easily understood from the description of the first, second, or third embodiments as described above.

Referring to FIG. 31, the display device 300C according to the fourth embodiment can include a plurality of protrusions 302, an adhesive layer 303, and a plurality of semiconductor light emitting devices 310, 320, 330.

Since each of the substrate 301, the plurality of protrusions 302, the adhesive layer 303, and the plurality of semiconductor light emitting devices 310, 320, 330 has already been described in detail above, hereinafter, different features will be mainly described.

The display device 300C according to the fourth embodiment can include a reflector 340.

For example, the reflector 340 can be made of a metal having excellent reflection characteristics, but is not limited thereto. For example, the reflector 340 can have a DBR structure in which materials having different refractive indices are repeatedly formed. In this case, the material can be an inorganic material such as SiOx, TiOx, SiNx, etc., but is not limited thereto.

For example, the reflector 340 can be formed together when one of the various layers formed on the substrate 301 is formed. For example, when the scan lines S1 to Sn or the data lines D1 to Dm shown in FIG. 3 are formed, the reflector 340 can be formed together.

For example, the reflector 340 can include a plurality of reflective patterns 341. Each of the reflective patterns 341 can be disposed to correspond to each of the semiconductor light emitting devices 310, 320, 330. For example, the reflective pattern 341 can be disposed between the substrate 301 and the adhesive layer 303, but is not limited thereto.

For example, the reflector 340 can be disposed under the semiconductor light emitting devices 310, 320, 330 disposed between the adjacent protrusions 302.

Accordingly, the light emitted downward from the semiconductor light emitting devices 310, 320, 330 can be reflected forward by the reflector 340, so the luminance can be improved due to an increase in the amount of light.

Meanwhile, the light emitted downward from the semiconductor light emitting devices 310, 320, 330 can proceed in the transverse direction along the adhesive layer 303, as shown in FIG. 32. For example, the adhesive layer 303 can serve as an optical waveguide, so light entering the adhesive layer 303 might be totally reflected in the adhesive layer 303 and travel in the lateral direction. In this case, mixed color light in which different color lights emitted from adjacent semiconductor light emitting devices 310, 320, 330 might be generated by the adhesive layer 303, and when the mixed color light is emitted forward, there might be a problem of remarkably lowering the image quality In an embodiment, the protrusion 302 can be disposed on the adhesive layer 303 corresponding to the region between the semiconductor light emitting devices 310, 320, 330. Accordingly, the protrusion 302 can serve as a blocking layer that can prevent light emitted from the adjacent semiconductor light emitting devices 310, 320, 330 from being mixed with each other.

In addition, the protrusion 302 can have a reflective function. For example, the protrusion 302 can be the reflector 340. To this end, the protrusion 302 can be formed of a metal having excellent reflective properties.

For example, when the scan lines S1 to Sn or the data lines D1 to Dm shown in FIG. 3 are formed, the protrusion 302 can be formed together. Therefore, light entering the adhesive layer 303 from the semiconductor light emitting devices 310, 320, 330 proceeds in the transverse direction, the light propagating in the lateral direction is reflected forward by the plurality of protrusions 302 disposed around the semiconductor light emitting devices 310, 320, 330, so luminance can be improved due to an increase in the amount of light.

Meanwhile, the display device 300C according to the fourth embodiment can include an insulating layer 350 and a black matrix 360.

The insulating layer 350 can be formed to be relatively thick to cover at least the semiconductor light emitting devices 310, 320, 330. The insulating layer 350 is a planarization layer, and a top surface of the insulating layer 350 can have a flat surface.

The insulating layer 350 can be formed of an organic material that can be easily formed thickly, but can also be formed of an inorganic material or a resin material.

The black matrix 360 can be formed of a material capable of absorbing light to reduce reflection of ambient light. The black matrix 360 can be disposed on the insulating layer 350 to correspond between the semiconductor light emitting devices 310, 320, 330. As another example, the black matrix can be disposed on the adhesive layer to correspond between the semiconductor light emitting devices 310, 320, 330.

Meanwhile, the insulating layer 350 and the black matrix 360 can be equally employed in the display devices 300, 300A, and 300B according to the first to fourth embodiments.

The above detailed description are not to be construed as restrictive in all respects and should be considered as examples. The scope of the embodiments should be determined by a reasonable interpretation of the appended claims, and all modifications within the equivalent scope of the embodiments are included in the scope of the embodiments.

EXPLANATION OF REFERENCE SIGNS

300, 300A, 300B, 300C: display device
3001_1 to 300_16: partition area
301: substrate
302: protrusion
303: adhesive layer
303_1: first adhesive layer
303_2: second adhesive layer
310: first semiconductor light emitting device
320: second semiconductor light emitting device
330: third semiconductor light emitting device
340: reflector
341: reflection pattern
350: insulating layer
360: Black Matrix
400, 400A: Interposer
3010: first area
3020: second area
3030: third area
3040: fourth area
3110: first groove
3120: second groove
3130: third groove
3350: dot pattern
3200: preset area
3210: edge
3220: side
3301 to 3303, 3311 to 3314, 3321 to 3324: projections
PX: Pixel
T: thickness of the protrusion
T11, T12: the thickness of the adhesive layer
L11, L12: distance

What is claimed is:

1. A display device comprising:
a substrate including a plurality of pixels;
a plurality of protrusions on the substrate;
an adhesive layer on the substrate; and
a plurality of semiconductor light emitting devices on the adhesive layer,
wherein a first group of the plurality of semiconductor light emitting devices are disposed in a first region of a pixel among the plurality of pixels, wherein the plurality of protrusions are disposed around the first group of the plurality of semiconductor light emitting devices in a second region of the pixel spaced apart from the first region, wherein the adhesive layer comprises a first adhesive layer disposed on the first region, and a second adhesive layer disposed on the plurality of protrusions, wherein a second thickness of the second adhesive layer is smaller than a first thickness of the first adhesive layer, and wherein the first group of the plurality of semiconductor light emitting devices are vertically overlapped with not the second adhesive layer but the first adhesive layer.

2. The display device according to claim 1, wherein the plurality of protrusions are arranged in a matrix within the pixel.

3. The display device according to claim 1, wherein the first group of the plurality of semiconductor light emitting devices comprise a first semiconductor light emitting device, a second semiconductor light emitting device and a third semiconductor light emitting device.

4. The display device according to claim 1, wherein the plurality of protrusions are arranged at regular intervals in the second region.

5. The display device according to claim 3, wherein the first semiconductor light emitting device comprises a red semiconductor light emitting device, wherein the second semiconductor light emitting device comprises a green semiconductor light emitting device, and wherein the third semiconductor light emitting device comprises a blue semiconductor light emitting device.

6. The display device according to claim 3, wherein a distance between the first to third semiconductor light emitting devices and the plurality of protrusions adjacent to each other in one direction is the same.

7. The display device according to claim 3, wherein the adhesive layer comprises at least one groove corresponding to each the first group of the plurality of semiconductor light emitting devices.

8. The display device according to claim 1, wherein a size of the plurality of protrusions is equal to or greater than that of each of the first group of the plurality of semiconductor light emitting devices.

9. The display device according to claim 1, wherein a thickness of the plurality of protrusions is at least ¼ times the first thickness of the first adhesive layer.

10. The display device according to claim 1, wherein the first adhesive layer is disposed on a side circumference of each of the plurality of protrusions.

11. The display device according to claim 1, wherein an upper surface of the plurality of protrusions is located higher than that of the first adhesive layer, and wherein each of the plurality of semiconductor light emitting devices is horizontally overlapped with a portion of each of the plurality of protrusions.

12. The display device according to claim 1, further comprising a reflector disposed under the plurality of semiconductor light emitting devices.

13. The display device according to claim 12, wherein the reflector comprises a reflective pattern disposed between the substrate and the adhesive layer.

14. The display device according to claim 1, wherein each of the plurality of protrusions is divided into a plurality of bumps, wherein the plurality of bumps are disposed on the second region, and wherein the second region of the pixel is a region where any semiconductor light emitting device is not disposed.

15. The display device according to claim 1, wherein each of the plurality of protrusions is divided into a plurality of bumps, and wherein the plurality of bumps are disposed at corners of the second region.

16. The display device according to claim 1, wherein each of the plurality of protrusions is divided into a plurality of bumps, and wherein the plurality of bumps are disposed on sides of the second region.

17. A display device comprising:

a substrate including a plurality of pixels;

a plurality of protrusions on the substrate;

an adhesive layer on the substrate; and a first group of a plurality of semiconductor light emitting devices on the adhesive layer, wherein the first group of the plurality of semiconductor light emitting devices are disposed in a first region of a pixel among the plurality of pixels, wherein the plurality of protrusions are disposed around the first group of the plurality of semiconductor light emitting devices in a second region of the pixel spaced apart from the first region, and wherein distances in one direction between adjacent protrusions among the plurality of protrusions and distances in the one direction between any one of the plurality of semiconductor light emitting devices and an adjacent protrusion among the plurality of protrusions are the same.

18. The display device according to claim 17, wherein the adhesive layer comprises a first adhesive layer disposed on the first region, and a second adhesive layer disposed on the plurality of protrusions, and wherein a second thickness of the second adhesive layer is smaller than a first thickness of the first adhesive layer.

19. The display device according to claim 18, wherein the first group of the plurality of semiconductor light emitting devices are disposed on the first adhesive layer.

* * * * *